US008866252B2

(12) United States Patent
Trajkovic et al.

(10) Patent No.: US 8,866,252 B2
(45) Date of Patent: Oct. 21, 2014

(54) POWER SEMICONDUCTOR DEVICES AND FABRICATION METHODS

(75) Inventors: Tanya Trajkovic, Cambridge (GB); Florin Udrea, Cambridge (GB); Vasantha Pathirana, Cambridge (GB); Nishad Udugampola, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 398 days.

(21) Appl. No.: 13/233,672

(22) Filed: Sep. 15, 2011

(65) Prior Publication Data

US 2013/0069712 A1    Mar. 21, 2013

(51) Int. Cl.
| H01L 23/58 | (2006.01) |
| H01L 29/66 | (2006.01) |
| H01L 29/78 | (2006.01) |
| H01L 29/739 | (2006.01) |
| H01L 29/10 | (2006.01) |
| H01L 29/06 | (2006.01) |
| H01L 29/423 | (2006.01) |

(52) U.S. Cl.
CPC ...... *H01L 29/0634* (2013.01); *H01L 29/66325* (2013.01); *H01L 29/7816* (2013.01); *H01L 29/7393* (2013.01); *H01L 29/1095* (2013.01); *H01L 29/66681* (2013.01); *H01L 29/7824* (2013.01); *H01L 29/1033* (2013.01); *H01L 29/1045* (2013.01); *H01L 29/7835* (2013.01); *H01L 29/42368* (2013.01)
USPC .......................................... 257/492; 257/493

(58) Field of Classification Search
CPC .............. H01L 29/063; H01L 29/0634; H01L 29/1095; H01L 29/7816
USPC .................................. 257/335, 492, 493, 577
See application file for complete search history.

(56) References Cited

U.S. PATENT DOCUMENTS

| 5,844,275 A * | 12/1998 | Kitamura et al. ............. 257/335 |
| 6,703,684 B2 | 3/2004 | Udrea et al. |
| 6,900,518 B2 | 5/2005 | Udrea et al. |
| 6,927,102 B2 | 8/2005 | Udrea et al. |
| 2011/0057230 A1 | 3/2011 | Udrea et al. |
| 2011/0156096 A1 | 6/2011 | Udrea et al. |

* cited by examiner

*Primary Examiner* — Matthew E Warren
(74) *Attorney, Agent, or Firm* — Tarolli, Sundheim, Covell & Tummino LLP

(57) ABSTRACT

We describe a RESURF semiconductor device having an n-drift region with a p-top layer and in which a MOS (Metal Oxide Semiconductor) channel of the device is formed within the p-top layer.

13 Claims, 21 Drawing Sheets

POWER SEMICONDUCTOR DEVICES AND FABRICATION METHODS

FIELD OF THE INVENTION

This invention relates to lateral power semiconductor devices, and more particularly to improved RESURF (REduced SURface Field) semiconductor devices and their fabrication methods. The techniques we describe are useful for high voltage semiconductor devices incorporated into power hybrid and integrated circuits. They are particularly advantageous for RESURF MOS (metal oxide semiconductor) devices such as LDMOSFETs and for MOS-bipolar transistors such as lateral insulated gate bipolar transistors (LIGBTs) incorporating RESURF.

BACKGROUND TO THE INVENTION

Lateral power devices typically operate with a voltage in the range 20 V to 1.2 KV. Power devices typically operate with a current in the range 10 mA to 50 A and typically higher than 0.1 A and smaller than 5 A. Such devices may also be referred to as "high voltage/power devices". These devices are typically capable of delivering from a few milliwatts to 1 Watt or even a few tens of Watts of power. Their applications range from domestic appliances, electric cars, motor control, and power supplies to RF and microwave circuits and telecommunication systems.

Lateral power devices have the high voltage/low voltage main terminals (variously called the anode/cathode, drain/source and emitter/collector) and the control terminal (termed the gate or base) placed at the top surface of the device in order to be easily accessible. In power ICs, such devices are often monolithically integrated with CMOS-type or BiCMOS-type low voltage and/or low power circuits and therefore it is desirable that the lateral high voltage devices are CMOS compatible. It is also possible that several high voltage, power devices may be integrated within the same chip: One or more silicon dice comprising one or more power devices may be housed in the same package as one or more silicon dice comprising low voltage, low power circuits. This co-packaged arrangement may benefit from the use of lateral power devices since the power die or dice and low voltage die or dice may be mounted on the same conductive die attach or lead frame, which may be connected to a reference potential such as ground or earth.

There are two main technologies that have emerged in the high voltage/power integrated circuit field. The first, Junction-Isolated (JI) technology, is based on using reverse-biased junctions for isolating adjacent devices. The second is using a buried insulating material such as silicon dioxide as a way to isolate the silicon active layer from the silicon substrate. Alternative technologies such as out PowerBrane technology (see U.S. Pat. No. 6,703,684; U.S. Pat. No. 6,900,518; and U.S. Pat. No. 6,927,102), where a membrane is used for isolation. In the first technology, Junction-Isolation, the high voltage device incorporates a high voltage RESURF (Reduced SURface Field effect) type junction. The RESURF effect is based on a more extensive growth of the depletion region at the surface than what is predicted through applying the 1D Poisson theory. This is achieved by the existence of two junctions adjacent to the drift region (one lateral and one vertical) that interact to create a more extensive depletion region inside the drift region. The semiconductor substrate has p-type conductivity and is ideally more lowly doped than the n-type drift region. In this case a depletion region forms deep into the semiconductor substrate (or a virtual substrate) as well as vertically in the drift region, resulting in a more extensive growth of the depletion region than that predicted by 1D junction. This allows the doping charge to be set at a higher value than that predicted by the one-dimensional Poisson theory, thereby lowering the on-state resistance of the device. In the second technology, SOI technology, part of the potential drop during the blocking mode can be supported across the buried insulating material. The substrate underneath is grounded and acts in a similar way to a field plate, which helps to expand the depletion region in the drift region more substantially than that predicted by the 1D junction Poisson theory.

To further reduce the resistance of the drift region, by increasing its doping and reducing (slightly) its length a double RESURF layer can be added. This layer is referred to as the p-top layer in this specification. The p-top layer can also be used to enable a single RESURF effect in SOI and membrane power devices. The p-top layer forms a third junction with the drift region, just below the surface. This junction is parallel to that formed between the n-drift and p-substrate layers. The action of this junction is similar to that of the RESURF effect and for this reason this approach is referred to as a double RESURF approach. In theory double RESURF can almost double the charge in the n-drift doping as compared to single RESURF. In some double RESURF implementations a further layer above the p-top layer may also be provided.

The p-top layer is commonly placed under the field oxide. Its presence can also help to reduce the hot carrier injection effect as it pushes the flow of the current in the bulk away from the silicon/oxide interface and reduces the electric field component that is perpendicular to the oxide/silicon interface.

The p-top layer may be used both in LDMOSFETs and LIGBTs as well as other lateral power devices that use the double RESURF effect. The MOS channel is usually built in the p-well of a lateral power device. It is often that the p-well is present in the CMOS process and is a deep diffusion (more than 3 μm and more commonly over 5 μm). The p-well diffuses both vertically and laterally. For a junction depth of 5 μm, a lateral diffusion length of approximately 4 μm is expected. When the transistor is biased in the on-state, the p-well/n-drift region is reverse biased and therefore a depletion region is formed around the physical junction extending laterally in the n-drift region. This depletion region, in combination with the depletion region formed around the p-top in the n-drift layer, tends to obstruct the electron flow (spreading) from the channel/accumulation layer into the drift region. This is similar to an unwanted (parasitic) JFET effect. The parasitic JFET effect introduces an additional voltage drop in the on-state and hence higher on-state losses. Moreover, since the p-well and the p-top are done at different stages in the process sequence, using different masks, there could be slight misalignment (within certain process tolerances, e.g. +/−0.5 μm) between these two layers. This misalignment results, however, in a smaller or larger pitch between the two depletion layers and, as a result, a smaller or larger parasitic voltage drop. This parasitic voltage drop is increasing with the voltage applied to the high voltage terminal (the high voltage terminal of a power device is often referred to as the drain, anode or collector terminal). The parasitic JFET effect leads therefore to non-uniform on-state behaviour from wafer to wafer and/or lot to lot.

SUMMARY OF THE INVENTION

According to a first aspect of the invention there is therefore provided a RESURF semiconductor device having an n-drift region with a p-top layer, and wherein a MOS (Metal Oxide Semiconductor) channel of said device is formed within said p-top layer.

Embodiments of the invention provide a number of advantages including a controllable reduced channel length, which facilitates achieving a reduced on-resistance and faster switching. The techniques are particularly advantageous for a high voltage LIGBT.

In some preferred embodiments the p-top layer comprises a first p-top portion formed in or adjacent the n-drift region, and a second p-top portion adjacent to one or both of an $n^+$ region and p-well region of a source structure of the device. The first and second p-top portions may, but need not necessarily be, separate from one another: in some embodiments the first and second p-top layer portions are separated by a portion of the n-drift region in which an accumulation layer forms when the device is in an on-state to provide a current path. In other embodiments, however, the first and second p-top portions may be portions of a single, contiguous layer, the first p-top portion acting as a RESURF layer for the n-drift region and the second p-top portion providing a MOS (metal oxide semiconductor) channel for the device, as described further blow. (The skilled person will appropriate that in the context of devices of the type we describe "metal" includes polysilicon).

In embodiments of the device the source structure comprises the $n^+$ region, a source connection to the $n^+$ region, and a p-well beneath the $n^+$ region (also connected to the source connection, preferably via a $p^+$ region). The n-drift region is bounded laterally by the p-well, and the second p-top portion extends above the n-drift region and is shallower than the p-well.

In embodiments the second p-top portion connects to both the $n^+$ region and the p-well region, and optionally to the source contact $p^+$ region. For example in a device in which, in a lateral transverse direction perpendicular to the longitudinal direction between the source and high voltage connection, the second p-top portion may connect to either to the $n^+$/p-well region or to the $p^+$ region, that is forming a "three-dimensional" device. The electrical connection of the second p-top portion to the $n^+$ region of the source structure may be either direct or via the p-well.

Preferably the second p-top portion further comprises a threshold adjust implant to define the threshold voltage for a gate connection to the device. The implant may comprise a region of increased or decreased doping, (depending upon whether p-type or n-type dopant is added).

The above described device structure may be employed in a range of different types of semiconductor device including, but not limited to, an LDMOSFET and an LIGBT. In each of these devices the source connection (in an LIGBT generally labelled as the cathode), is a low voltage connection, the gate connection being held at a small positive voltage above the source connection voltage to turn the device on. The second input/output connection of the device is a high voltage connection (typically at a large positive voltage with respect to the source), and this may be either a drain connection (in an LDMOSFET) or an anode connection (in an LIGBT).

Thus embodiments of the device also include a high voltage structure for a drain or anode connection of the device, the high voltage structure comprising an n-well and a high voltage connection to the n-well. The n-drift region extends to the n-well of this high voltage structure. Where the device is an LIGBT this high voltage structure further comprises a $p^+$ region within the n-well, electrically connected to the high voltage connection of the device, to provide an anode connection for the LIGBT.

In embodiments the device comprises a gate oxide layer over the second p-top portion and over a portion of the n-drift region laterally between the first and second p-top portions. The device also includes a field oxide layer over the first p-top portion and optionally directly over a portion of the n-drift region. A gate electrode is provided over the gate oxide and (a portion of) the field oxide. The gate electrode lies above at least the second p-top portion, and preferably also over the portion of the n-drift region laterally between the two p-top portions. Optionally the gate electrode may also lie over part of the first p-top portion.

Functionally, the first (RESURF) p-top portion helps the blocking capability of the device and the second p-top portion provides a channel for the device. Thus there is a separation between the two p-top portions to enable a current flow into and through the n-drift region. However this separation need not be present everywhere in the p-top layer: for example it may be provided by islands of n-type material, more particularly $n^+$ material (to release electrons). Such islands can be employed to suppress unwanted JFET behaviour. Thus, for example, if a longitudinal direction in the lateral plane of the device is defined by a direction between the source and high voltage connection of the device then at some point in a transverse direction in the lateral plane the p-top layer may be continuous and at other points the p-top layer may be interrupted by islands of n or $n^+$-type material.

Whichever arrangement is employed, however, the device is configured such that when a high voltage is employed across the n-drift region a flow of current through the n-drift region is controlled by applying a voltage to the gate electrode to control a current flow through a channel, more particularly inversion layer, at the surface of the second p-top portion when the device is on, and such that a surface field of the n-drift region of the device is reduced by the first p-top region when the device is off and in a blocking mode. Thus in embodiments the p-top layer has one or more lateral gaps comprising one or more n-type regions: to one lateral side of the gap the p-top region comprises a MOS channel of the semiconductor device and to an opposite lateral side of the gap the p-top region comprises an n-drift region surface-field-reducing part of the semiconductor device.

The semiconductor device may be a double RESURF device on a p-type substrate or the device may be fabricated on an SOI (silicon on insulator) substrate with the buried oxide layer beneath the n-drift region. In still further embodiments at least a portion of the device, more particularly the n-drift region portion, is fabricated in a membrane suspended above the substrate. Thus in such embodiments an opening is provided beneath a portion of the buried oxide layer beneath the n-drift region such that the buried oxide is suspended by adjacent portions of the substrate.

In preferred embodiments of the device the first and second p-top portions are formed in the same process step, with a common mask, and have substantially the same doping. More particularly, the first and second p-top portions have substantially the same doping dose—although the skilled person will appreciate that in the finished device the charge within these regions may end up being slightly different because of segregation in the oxide, particularly losses to the field oxide. As described further below this is a particularly useful technique because the first and second p-top portions have a spatial relationship with respect to one another which is locked by the mask. This enables accurate and repeatable channel definition and also, in consequence, reliable and repeatable fabrication of devices with a short channel length, for example less than 4 μm, 3 μm, 2.5 μm, or 2 μm.

In a related aspect the invention provides a high-voltage RESURF semiconductor device, the device having first and second input/output connections and at least one control connection; wherein the device comprises: a substrate; a first well of a first conductivity type electrically connected to said first input/output connection; a second well of a second, opposite conductivity type electrically connected to said second input/output connection; a drift region of said second conductivity type extending between said first and second wells; and an upper RESURF layer of said first conductivity type within or adjacent said drift region and on an opposite vertical side of said drift region to said substrate; and wherein the device further comprises a lateral extension to said first well, wherein said lateral extension has said first conductivity type, a shallower depth than said first well, and extends laterally into said drift region under said control connection.

In embodiments the first input/output connection is low voltage (source) connection and the second input/output connection is a high voltage (drain/anode) connection of the device. Preferably the lateral extension includes a shallow region of altered—either increased or decreased—doping to control the threshold voltage of the device.

In embodiments the first well includes a region of the second conductivity type, for example an $n^+$ region, connected to the first input/output connection, and the lateral extension is connected to one or both of the first (p) well and the region of the second conductivity type. In embodiments the lateral extension to the first well is contiguous with the upper RESURF layer and includes one or more island regions of the second conductivity type connecting to the drift region. The lateral extension to the first well may comprise, for example, a region laterally adjacent to and connecting with the first well, or a region above a portion of the first well.

In embodiments the second well (at the high voltage end of the device) includes either a region of the second conductivity type, for example in the case of an LDMOSFET, or a region of the first conductivity type, for example in the case of an LIGBT.

Embodiments of the device comprise oxide (gate oxide and field oxide) extending over the lateral extension to the first well and the upper RESURF layer, and a gate electrode on the oxide layer extending over the extension to the first well, over at least a portion of the upper RESURF layer, and over a portion of the drift region between the lateral extension to the first well and the upper RESURF layer. In embodiments a channel length of the device is defined as a length of the lateral extension measured between a maximum extension of the lateral extension towards the second (high voltage) input/output connection and the region of the second conductivity type in the first well. In some embodiments this channel length is less than 4 μm, 3 μm or 2.5 μm.

Embodiments of a device as described above may be integrated with low voltage circuitry in a power integrated circuit, in particular a CMOS power integrated circuit. Thus such a power integrated circuit may comprise a device of the type described above and CMOS cells comprising at least a p-well CMOS cell and an n-well CMOS cell, the two CMOS cells comprising complementary respective metal oxide semiconductor transistors. These transistors may share a common p-type substrate with one or more power semiconductor devices as described above.

In a related aspect the invention provides a method of using a RESURF semiconductor device, the device having an n-drift region with a p-top layer, wherein a MOS (Metal Oxide Semiconductor) channel of said device is formed within said p-top layer, wherein said p-top layer comprises a first p-top portion in or adjacent said n-drift region and a second p-top portion adjacent to an $n^+$ region or p-well region of a source structure of said device; the method comprising: applying a high voltage across said n-drift region: controlling a flow of current through said n-drift region by applying a voltage to a gate electrode of said MOS channel to control a current flow through a channel at the surface of said second p-top portion when said device is on; and reducing a surface field of said n-drift region of said device using said first p-top region when said device is off and in a blocking mode.

Thus in embodiments of this method one portion of the p-top layer is used to form an inversion layer for a channel of the device when the device is on and another portion of the p-top layer is used to assist voltage (potential) blocking when the device is in an off-state and in a blocking mode.

In a further related aspect the invention provides a method of forming a RESURF semiconductor device, the method comprising: forming a n-drift region of the device on a semiconductor substrate; forming a p-top layer on or in said n-drift region; and forming source, high-voltage and gate structures of said device; wherein the method further comprises; forming a channel region of said device in said p-top layer.

As the skilled person will appreciate, the channel region of the device is the region where, when the device is on, the electron channel forms.

In preferred implementations of the method, forming both the channel region of the p-top layer and the RESURF region of the p-top layer adjacent to the n-drift region use the same mask, and preferably both the channel region and the RESURF region of the device are formed in the same processing step. This approach locks the spatial positions of the channel and RESURF regions of the device, both in the same p-top layer, with respect to one another. This helps to achieve uniform on-state behaviour from one device/wafer/lot to the next, as well as enabling the use of a shorter channel, which in turn can reduce device on-resistance.

In embodiments forming of the channel region of the device includes configuring a channel portion of the p-top layer to connect to the source structure of the device and arranging the channel portion of the p-top layer to be under a gate electrode of the device. The channel portion of the p-top layer may be connected to an $n^+$ region of the source structure of the device either directly or indirectly via a p-well formation.

Preferred implementations of the method also include a step of implanting the channel portion of the p-top layer to adjust a threshold voltage of the device either up or down by adding either p-type or n-type dopant.

In one implementation the method further comprises providing a substrate, forming the n-drift region on the substrate as previously described; then forming n-well and p-well structures for the source and high-voltage connections; then forming the p-top layer, using a common mask to define RESURF and channel/extension portions of the p-top layer; then forming the field oxide and gate oxide regions of the device; followed by $p^+$ and $n^+$ implantations and fabrication of metal (polysilicon) connections for the device.

In some preferred embodiments, particular where an LIGBT device is being formed, the method may also include providing an electrical connection to the bottom of the substrate, for example by means of a metal-enriched adhesive (for example epoxy adhesive) and/or metal. In such a case an intermediate layer may be provided below the substrate to suppress charge injection from the substrate into this connection, more particularly to suppress a Schottky barrier between this connection and the substrate. This is described further in our co-pending U.S. patent application Ser. No. 12/648,847 (US2011/0156096), hereby incorporated by reference.

The invention further provides a method as described above in which the p/n conductivity types of the structures are interchanged.

It will be appreciated that the terms "top" and "bottom", "above" and "below", and "lateral" and "vertical", may be used in this specification by convention and that no particular physical orientation of the device as a whole is implied.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Broadly speaking we will describe a lateral high voltage device where the p-top is used both as a double RESURF layer and as the background doping for the MOS channel in a high voltage lateral device. The process of forming the p-top in the channel region does not require any additional mask layer or processing steps as it is done at the same time and using the same mask as that for the double RESURF layer.

Instead of using the p-well as the background region for the MOS channel which could result in a long lateral diffusion and therefore high channel length, the use of the p-top in the channel region leads to a shorter channel length and therefore higher transconductance for the MOS channel. The reason that the channel formed in the p-top is shorter is because the p-top is a shallower layer and hence its lateral diffusion is significantly smaller than that of the p-well. In addition, due to the fact that the p-top is a much shallower layer than the p-well, the parasitic JFET effect is considerably reduced leading to additional lower on-state losses. Furthermore, the parasitic JFET is determined now by the depletion regions in the n-drift region around p-top in the channel region and around the p-top in the double RESURF region. The two regions of p-tops are done using the same mask in the same process step. As a result the parasitic JFET effect is stable and there are no significant variations in the parasitic on-state voltage drop due to it from wafer to wafer and lot to lot.

Figure 1:
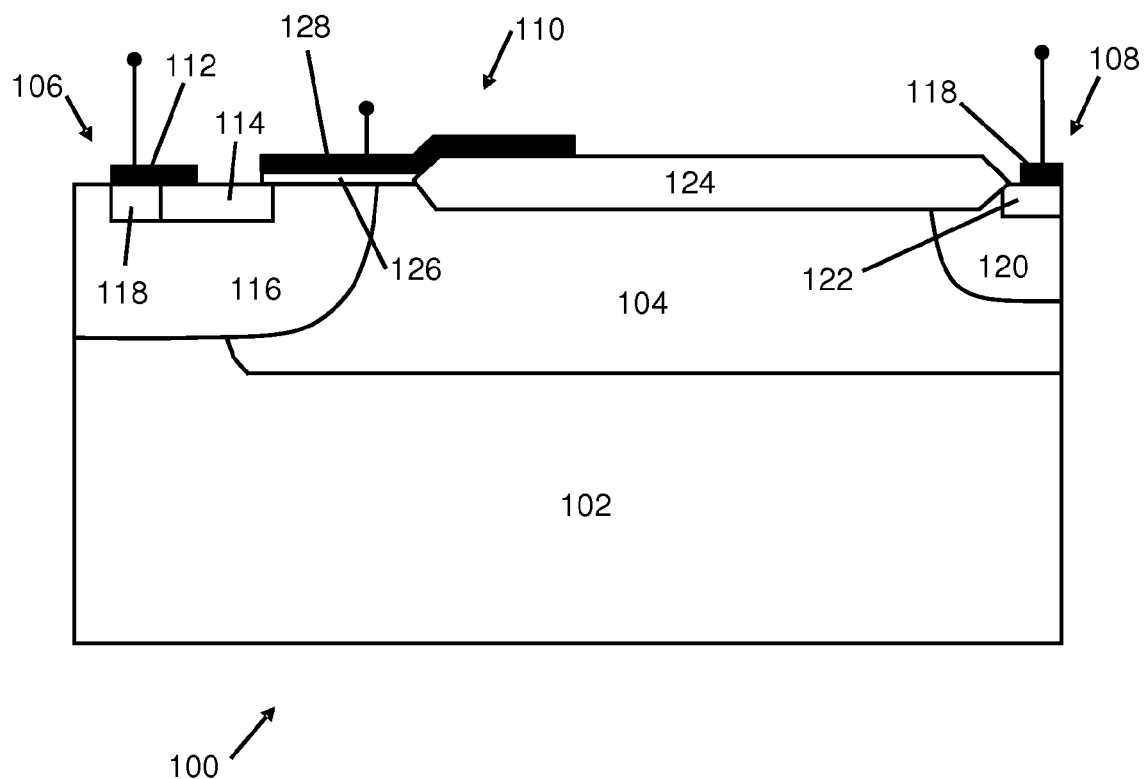
FIG. 1 shows, schematically, a vertical cross-section view of a high voltage lateral diffused metal oxide semiconductor field effect transistor (LDMOSFET) with single RESURF, according to the prior art.

Referring now to FIG. 1, this shows an example of an LDMOSFET 100 using the RESURF effect in bulk technology. The LDMOSFET 100 comprises a p-type substrate 102 on which are formed an n-drift region 104, a source structure 106, a drain structure 108 and a gate structure 110. The source structure comprises a metal (polysilicon) source connection 112 electrically connected to an n$^+$ region 114 and to a p-well 116 via a p$^+$ contact region 118. (The p$^+$ region helps to remove holes from the p-well thus inhibiting a parasitic bipolar transistor effect).

The drain structure comprises a drain connection 118 to an n-well region 120 via an n$^+$ connection region 122. A field oxide layer 124 is provided over the n-drift region 104, and a gate oxide layer 126 is provided over the p-well 116 and a portion of the n-drift region 104 typically the gate oxide 126 and field oxide 124 are formed in different steps and by different processes, for example by a dry process and a wet process respectively. A gate connection 128 is provided over the gate oxide 126 and a portion of the field oxide 124.

In operation the MOS channel is formed in the p-well 116, more particularly as an inversion layer at the upper surface of p-well 116 beneath the gate oxide 126, allowing electrons to flow from the source connection 112 into the n-drift region 104. In the arrangement of FIG. 1 the MOS channel length is defined by the difference in the lateral diffusion of p-well 116 and that of the n$^+$ source 114.

In the following figures like elements to those already described are indicated by like reference numerals.

Figure 2:
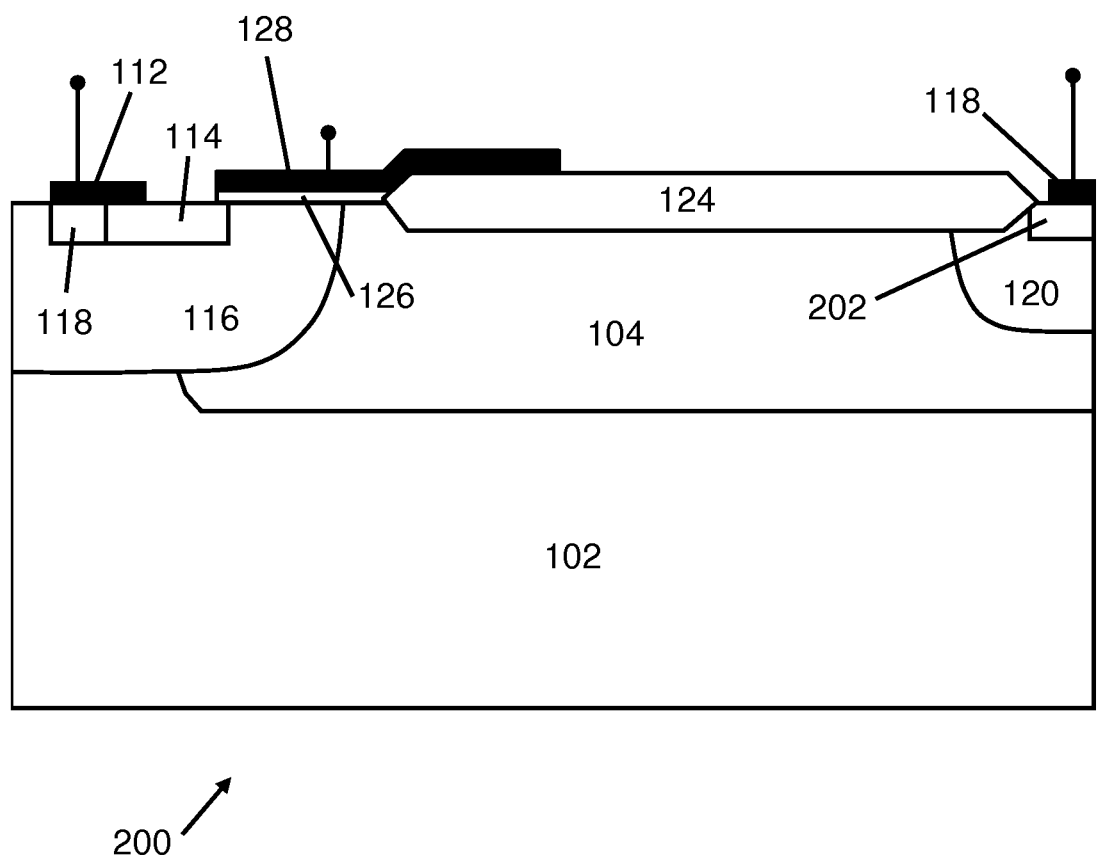
FIG. 2 shows, schematically, a vertical cross-section view of a high voltage lateral insulated gate bipolar transistor (LIGBT) with single RESURF, according to the prior art.

FIG. 2 illustrates an LIGBT structure 200, similar to that of FIG. 1. In the LIGBT structure the n$^+$ region 122 is replaced by a p$^+$ injector region 202 within n-well 120 and the drain 118 and source 112 connections become, respectively, anode/drain and cathode/source connections. Again the MOS channel is formed in p-well 116 and the MOS channel length is given by the difference in the lateral diffusion of p-well 116 and that of the n⁺ source 114.

Figure 3:
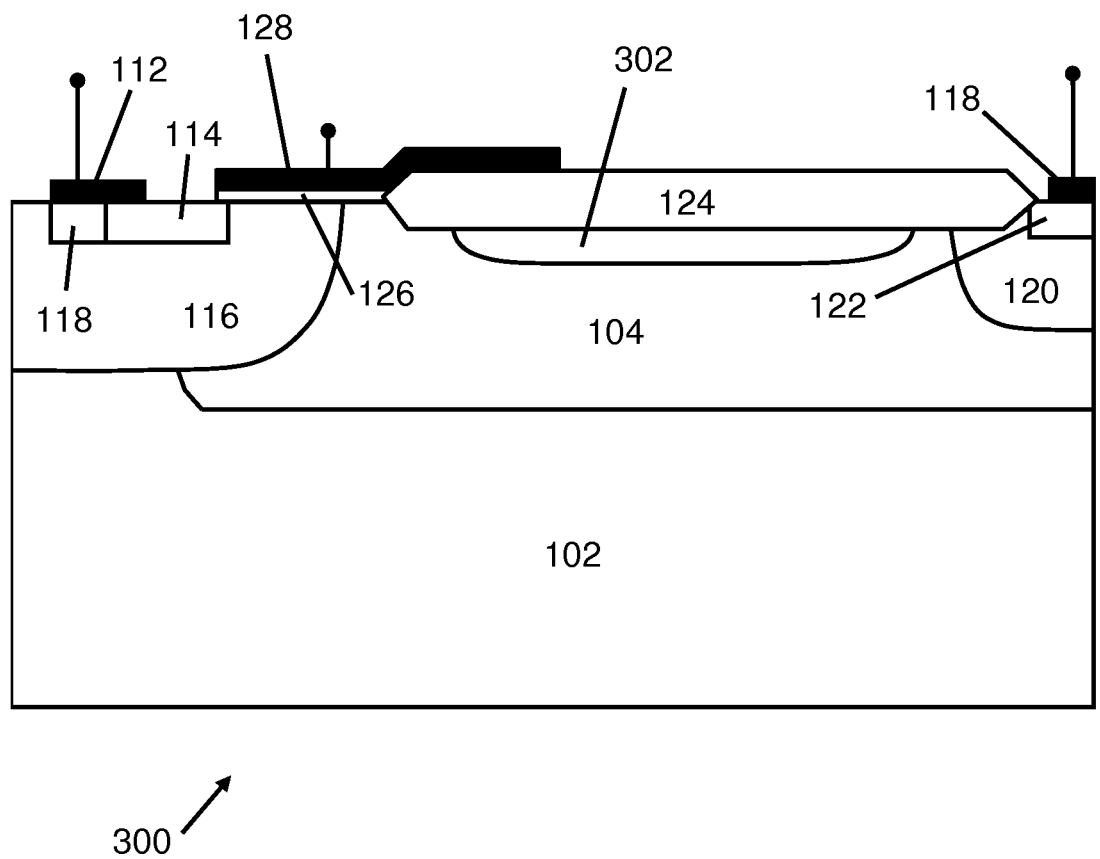
FIG. 3 shows, schematically, a vertical cross-section view of a double RESURF LDMOSFET.

FIG. 3 shows an LDMOSFET 300 similar to that of FIG. 1 but employing a double RESURF effect (again in bulk technology). Thus LDMOSFET 300 comprises an additional p-top region 302 under field oxide 124. This p-top region forms a diode junction with n-drift region 104 and, in combination with the junction of n-drift region 104 with p-type substrate 102 provides a double RESURF effect, providing an improved trade-off between breakdown voltage and on-resistance. Again the MOS channel length is given by the difference in the lateral diffusion of the p-well 116 and that of the n⁺ source 114.

Figure 4:
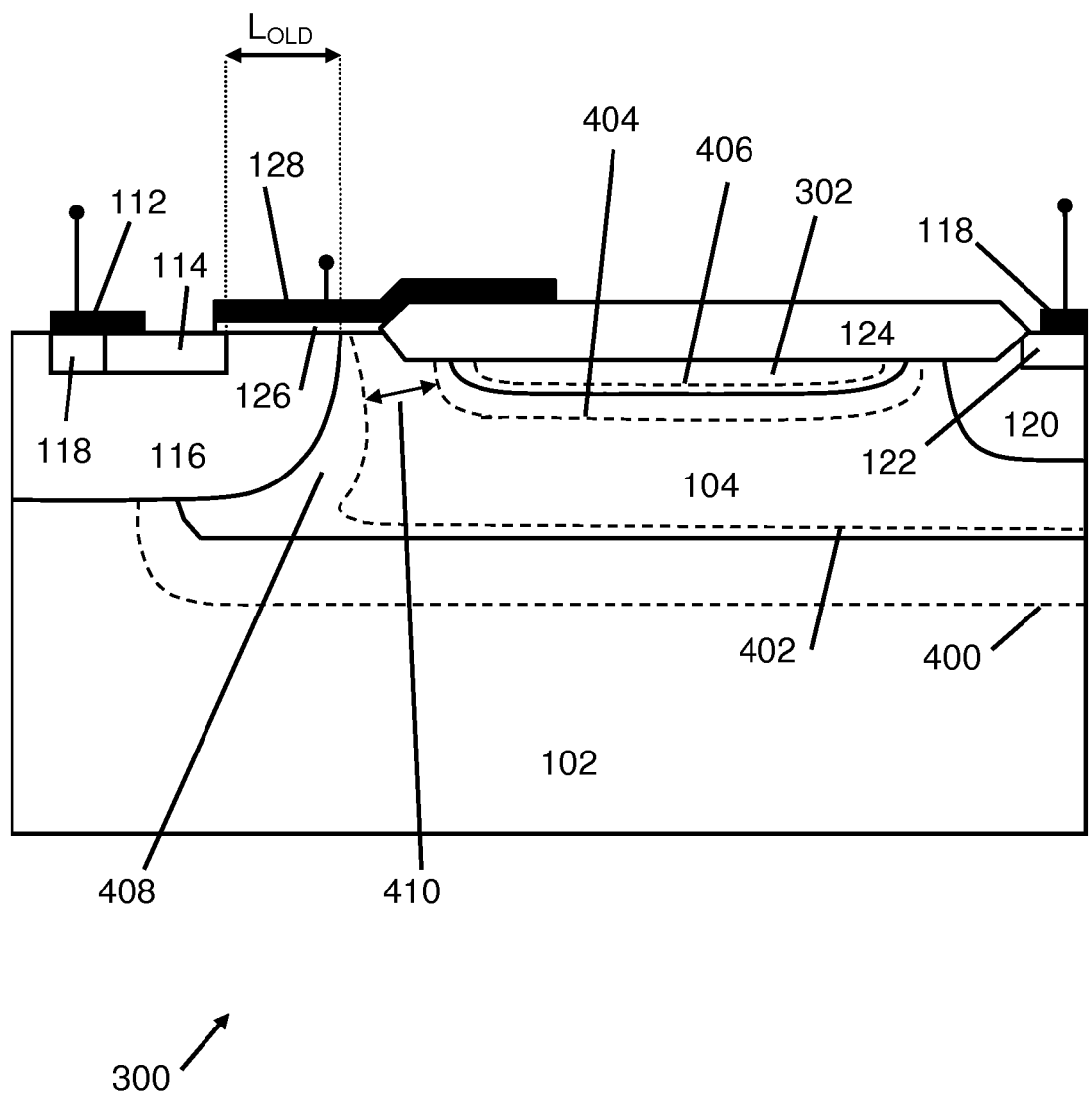
FIG. 4 shows, schematically, a vertical cross-section view of the LDMOSFET of FIG. 3, illustrating depletion regions.

FIG. 4 shows the double RESURF LDMOSFET of FIG. 3, illustrating the transistor when biased into on-state with the source (low voltage terminal) grounded, the drain positively biased, for example at a voltage of 1 volt to 20 volts, and the gate (control terminal) positively biased above the threshold, for example to a voltage of approximately 5 volts. As previously described, the MOS inversion layer channel is formed in the p-well 116, and the MOS channel length is given by the difference in the lateral diffusion of the p-well and that of the n⁺ source, in FIG. 4 marked as length $L_{OLD}$. The figure also illustrates boundaries 400, 402, 404, 406 of depletion regions when the transistor is biased in this state, showing the depletion region 408 formed around the p-well 116, and the depletion regions 404, 406 formed around the p-top layer 302. The figure also illustrates the parasitic JFET obstruction 410 of the current flow between the two depletion regions formed around the p-top and p-well regions. This parasitic JFET effect impedes current flow from the accumulation layer (at the upper surface of n-drift 104 beneath the gate oxide) into the drift region and beyond. The ohmic voltage drop in this region gives rise to unwanted increased losses in the on-state.

Figure 5:
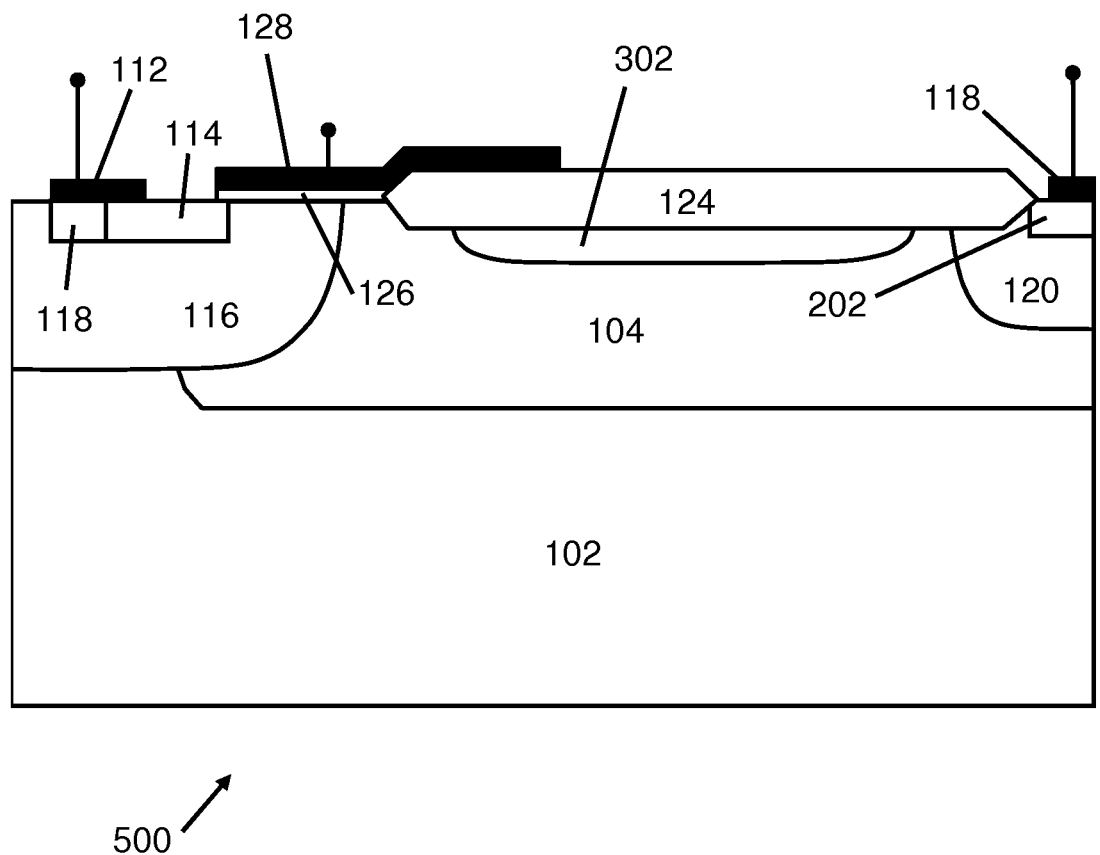
FIG. 5 shows, schematically, a vertical cross-section view of a double RESURF LIGBT.

FIG. 5 shows an LIGBT structure 500 similar to that of FIG. 2, but incorporating an additional p-top layer 302 under the field oxide 124 to provide a double RESURF effect. The MOS channel length is as previously described.

Figure 6:
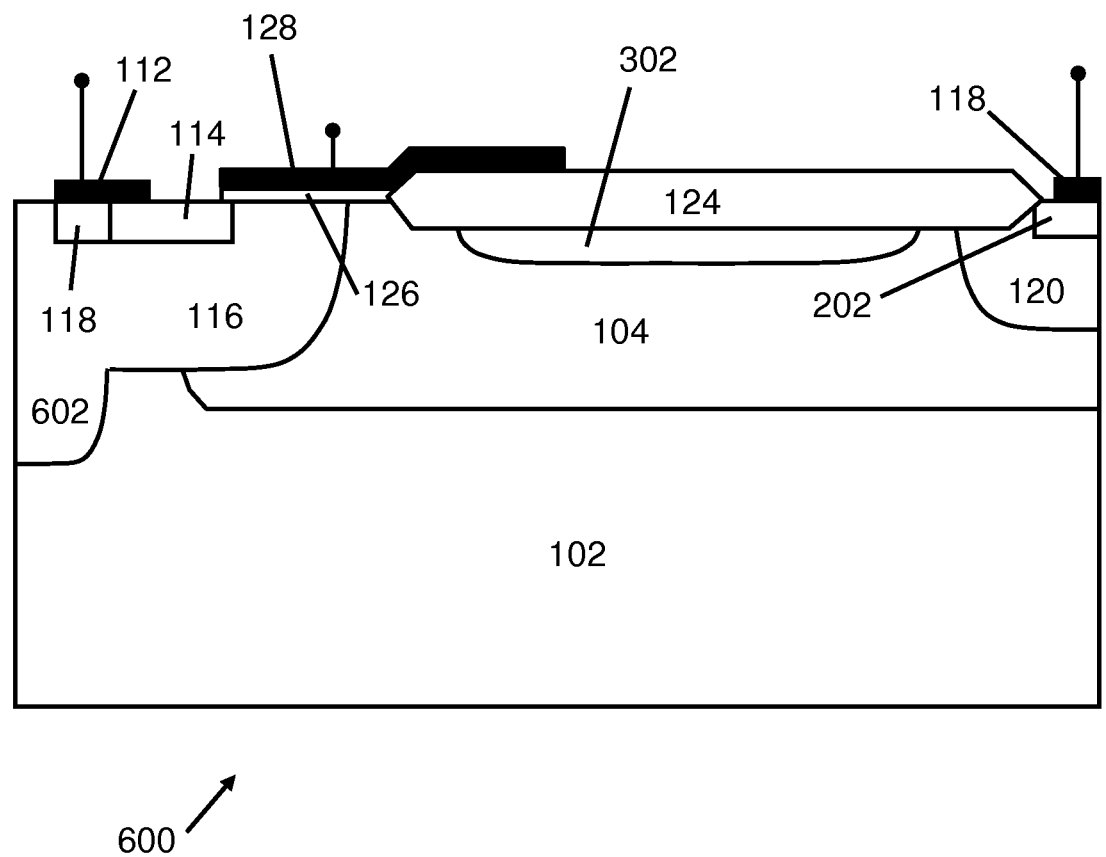
FIG. 6 shows, schematically, a vertical cross-section view of a double RESURF LIGBT incorporating a p$^+$ sink.

FIG. 6 shows a similar LIGBT structure 600, but in this example incorporating an additional p⁺ sinker region 602 beneath p-well 116. This is provided to more efficiently collect the holes and inhibit latch-up of the device (turn-on of the parasitic npn transistor with the n⁺ source as the emitter).

Figure 7:
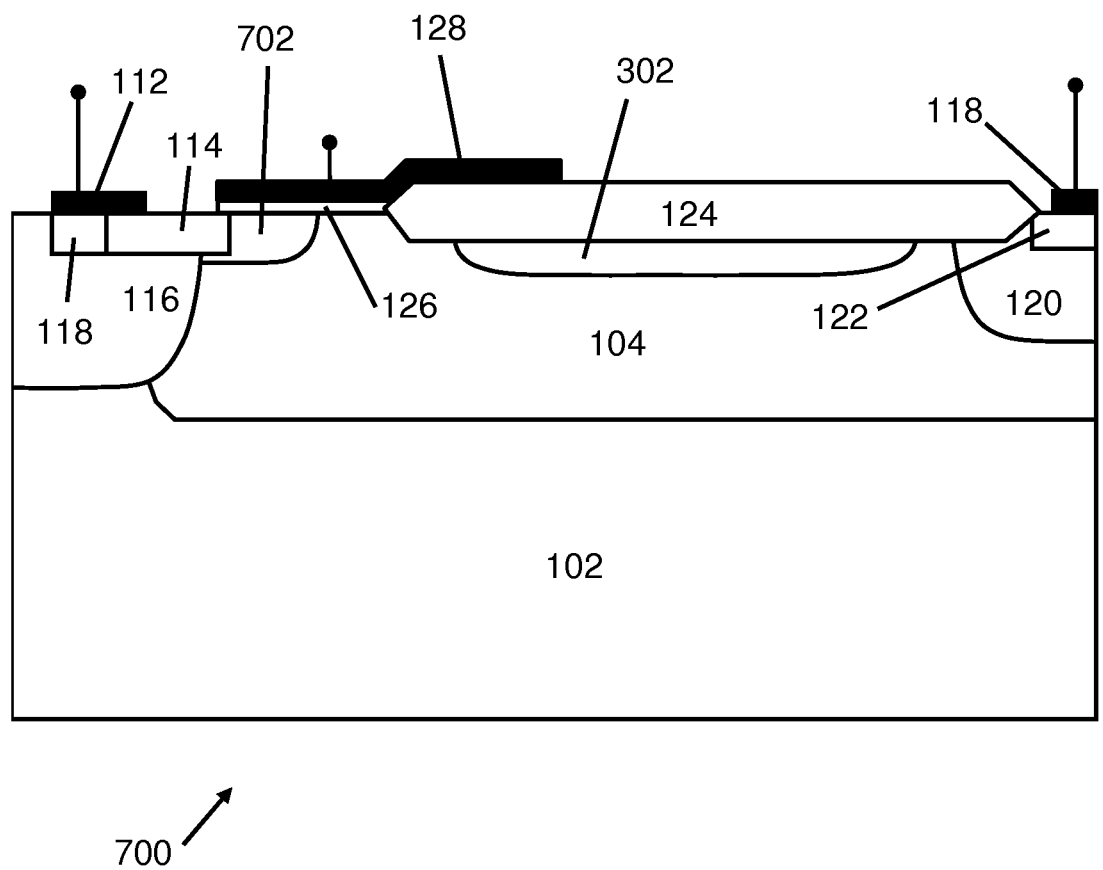
FIG. 7 shows, schematically, a vertical cross-section view of a double RESURF LDMOSFET according to an embodiment of the invention.

Referring now to FIG. 7, this shows a cross-sectional view of a high voltage MOSFET 700 employing a double RESURF effect in bulk technology, and in which the MOS channel is formed in the p-top layer.

Thus in the LDMOSFET 700 the p-top layer is patterned into a first, RESURF portion 302 as previously described and a second, channel portion 702 forming a lateral extension to p-well 116. (The slightly different depths of the two p-top regions is an artefact of the different field and gate oxide formation processes).

Figure 8:
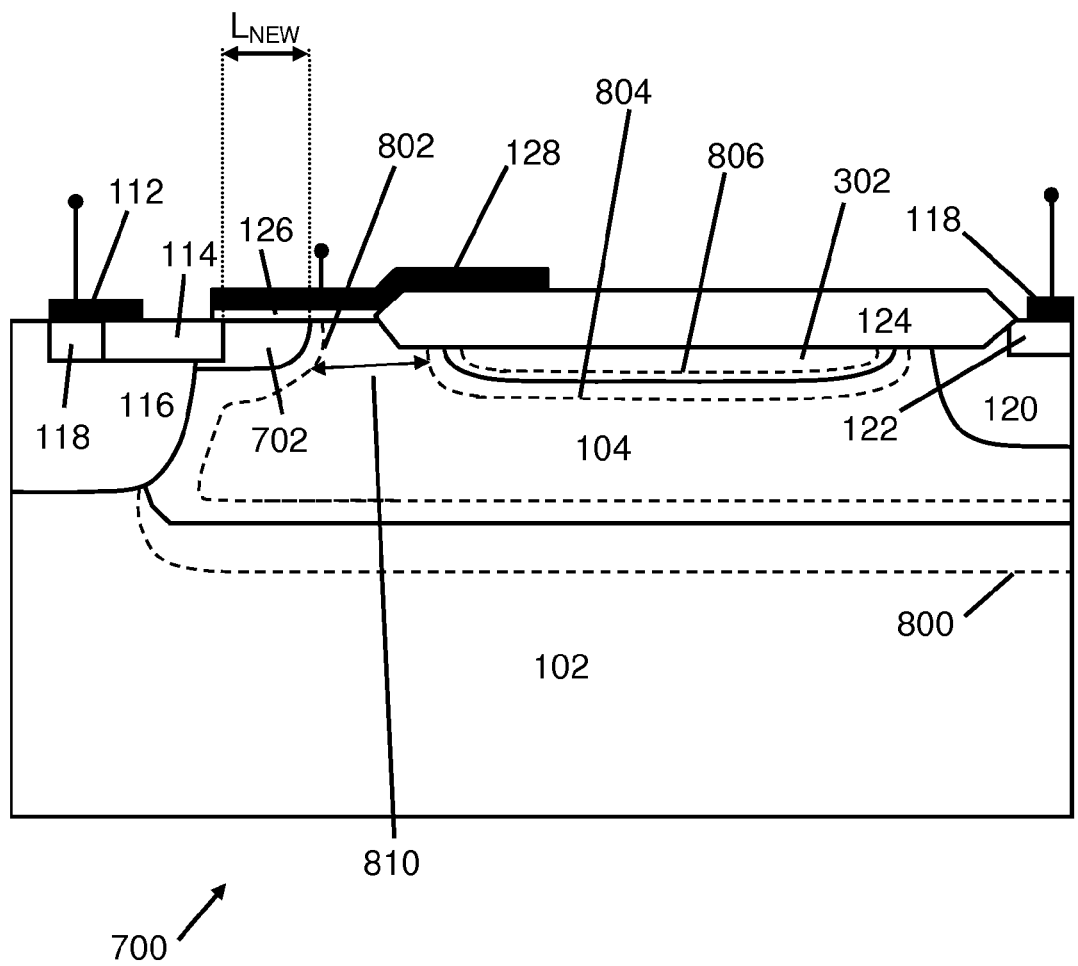
FIG. 8 shows the LDMOSFET of FIG. 7a, illustrating depletion regions.

Referring now to FIG. 8, this illustrates the LDMOSFET 700 of FIG. 7, also showing the two depletion regions 800, 802; and 804, 806 formed around the channel p-top portion/ p-well/p-type substrate and the RESURF p-top regions respectively. As can be seen by comparison with FIG. 4, the depletion region around p-well 116 is substantially reduced. Arrows 810 illustrate the parasitic JFET obstruction of the current flow between the two depletion regions formed around the two p-top regions 302, 702. It can be seen that, by comparison with FIG. 4, there is a wider pitch between the two parasitic JFET regions formed around the two p-top layer portions. Because the channel p-top portion 702 is shallower and less extended than the p-well 116 the JFET pitch in the drift region 810 is wider, resulting in a much reduced parasitic JFET voltage drop in the on-state.

In the device 700 the MOS channel length, $L_{NEW}$, is given by the difference in the lateral diffusion of the p-top portion 702 under the insulated gate 128 and that of the n⁺ source 114. This is because the MOS channel is now formed in the second, channel p-top portion 702 as compared to the arrangement of FIG. 4 where the MOS channel is formed in the p-well 116.

As can be seen by comparing, for example, FIGS. 8 and 4, the channel length $L_{NEW}$, of a device according to the embodiment of the invention is significantly reduced compared with the channel length, $L_{OLD}$, of the FIG. 4 arrangement. This provides a number of advantages including providing a lower on-state resistance due to increased separation between the channel and p-top RESURF layers (reducing parasitic JFET effects). In embodiments the channel length may be, for example, in the range approximately 1 μm to 2 μm, a factor of 2 or more reduction as compared with the FIG. 4 arrangement.

Moreover the JFET pitch can be widened to in the range approximately 4 μm to approximately 7 μm, again an increase by a factor of 2 or more (without changing other physical dimensions).

A further advantage of the arrangement of FIGS. 7 and 8 is that the first, RESURF p-top portion 302 and the second, channel p-top portion 702 may be fabricated at the same time, using the same mask. This effectively locks the distance between the channel and p-top RESURF layers, minimising the variability of this distance and hence the variability of the device on-state characteristics (and reducing the variation in the JFET effect) across the wafer and between lots. This also facilitates providing a shorter channel (and hence reduced on-state resistance) than is reliably possible when using the p-well layer to define the channel.

The p-top layer is typically 0.5 μm to 3 μm deep and its length and doping vary according to the voltage rating of the device. For a 700 V device, the length of the p-top RESURF portion can be between 30 μm to 50 μm and the surface/ maximum doping concentration can be $2\times10^{15}$ cm⁻³ to $1\times10^{16}$ cm⁻³. For 700 V the drift region has a typical doping concentration between $5\times10^{14}$ cm⁻³ to $5\times10^{15}$ cm⁻³. The doping concentration of the p-top layer is higher than the doping concentration in the n drift layer.

Figure 9:
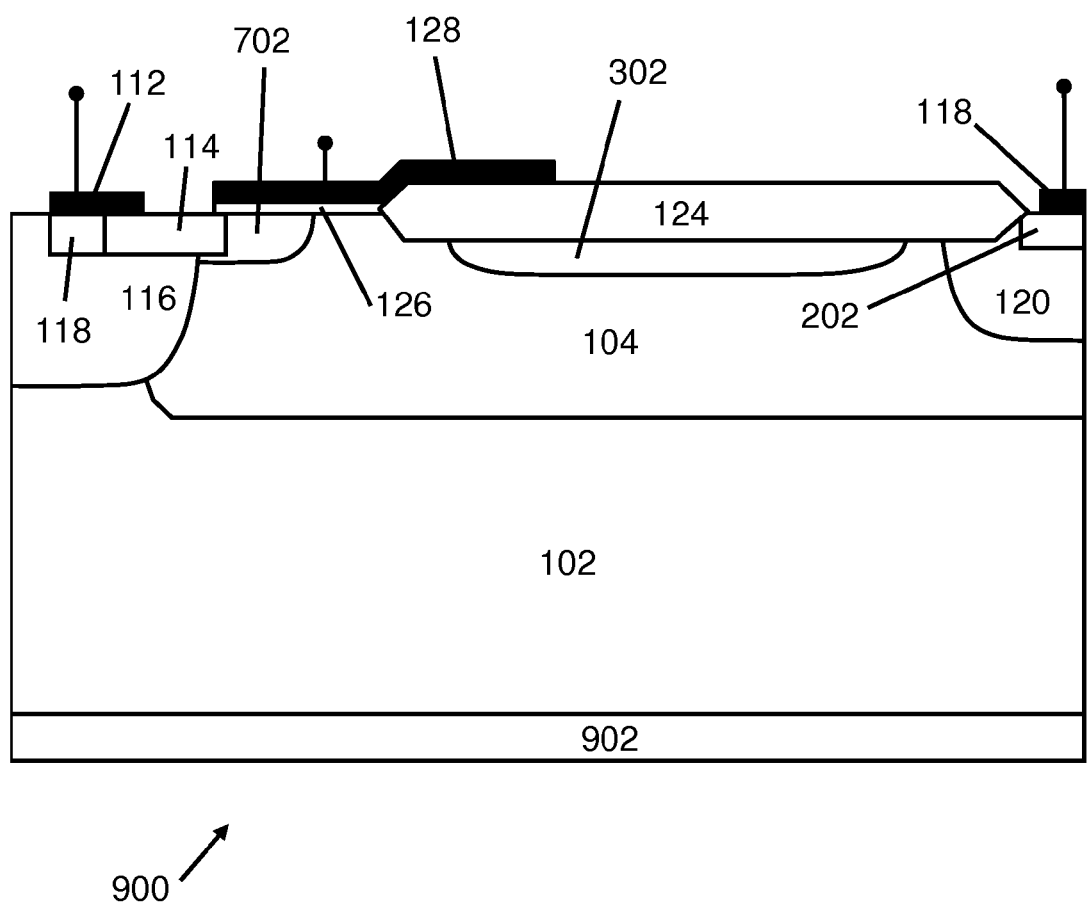
FIG. 9 shows, schematically, a vertical cross-section view of a double RESURF LIGBT according to an embodiment of the invention.

FIG. 9 shows an example of a high voltage LIGBT structure 900, using a double RESURF effect in bulk technology, according to an embodiment of the invention. The structure is similar to that of FIG. 7 except that the drain n⁺ 122 is replaced by a p⁺ injector region 202 connected to the anode/ drain. The MOS channel is formed in a similar manner to that described with reference to FIGS. 7 and 8, and, likewise, the MOS channel length is given by the difference in the lateral diffusion of the channel p-top portion and that of the n⁺ source. With this approach the channel length is much shorter than that of the LIGBT structure of FIG. 2, and the parasitic JFET regions are less prominent and more stable, which together leads to lower on-state losses and more stable I-V characteristics in the on-state.

In some preferred embodiments an additional layer 902 may be provided between the p-type substrate 102 and an underlying ground connection (not shown) comprising, for example, a metal-enriched epoxy attaching the device to a (grounded) lead frame. Layer 902 may be, for example, a p⁺ type layer, a p⁺ type layer in combination with an underlying metal layer, or an insulating layer, as described in more detail in our US2011/0156096.

Figure 10:
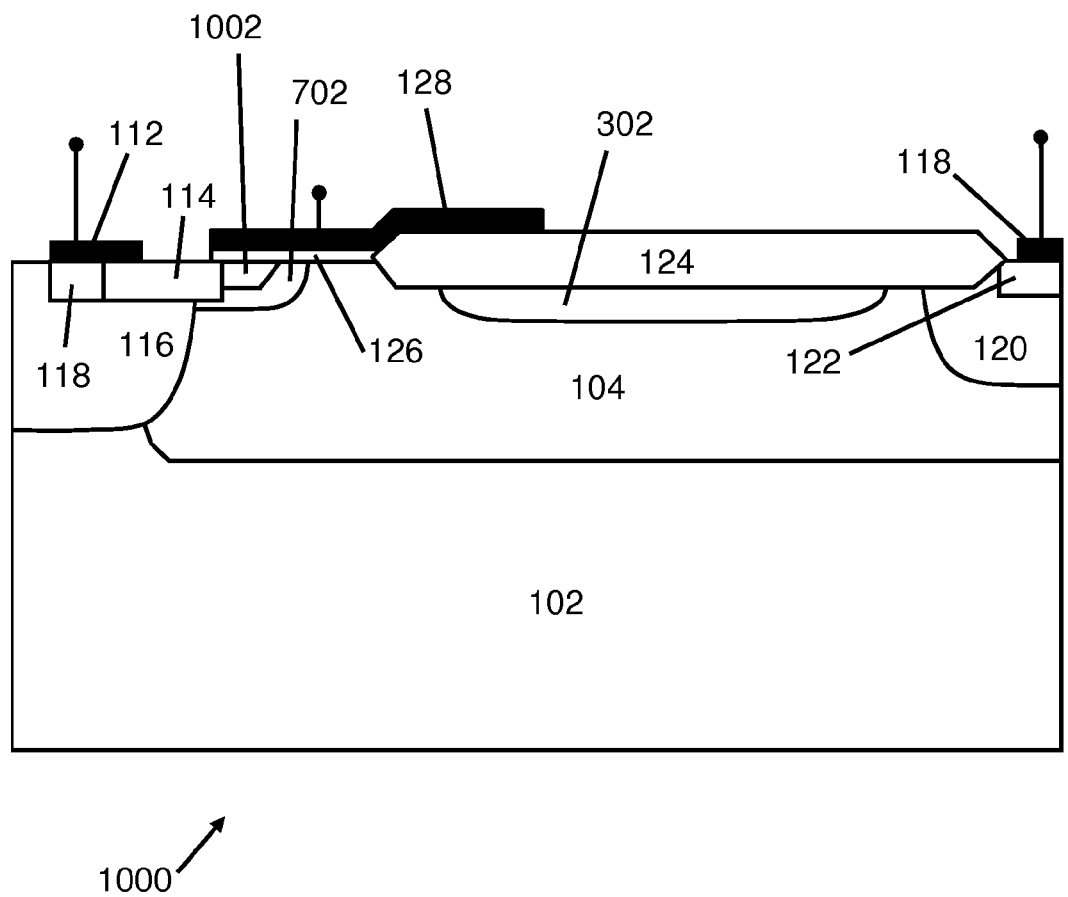
FIG. 10 shows, schematically, a vertical cross-section view of a double RESURF LDMOSFET according to an embodiment of the invention, incorporating a threshold adjust implant.

FIG. 10 shows an LDMOSFET structure 1000 similar to the structure 700 of FIG. 7, but incorporating an additional (shallow) threshold adjust 1002. This may comprise increase p-type doping or a region of added n-type doping to decrease the overall doping of the channel p-top portion 702. This threshold adjust implant is added to adjust the threshold voltage of the device.

Figure 11:
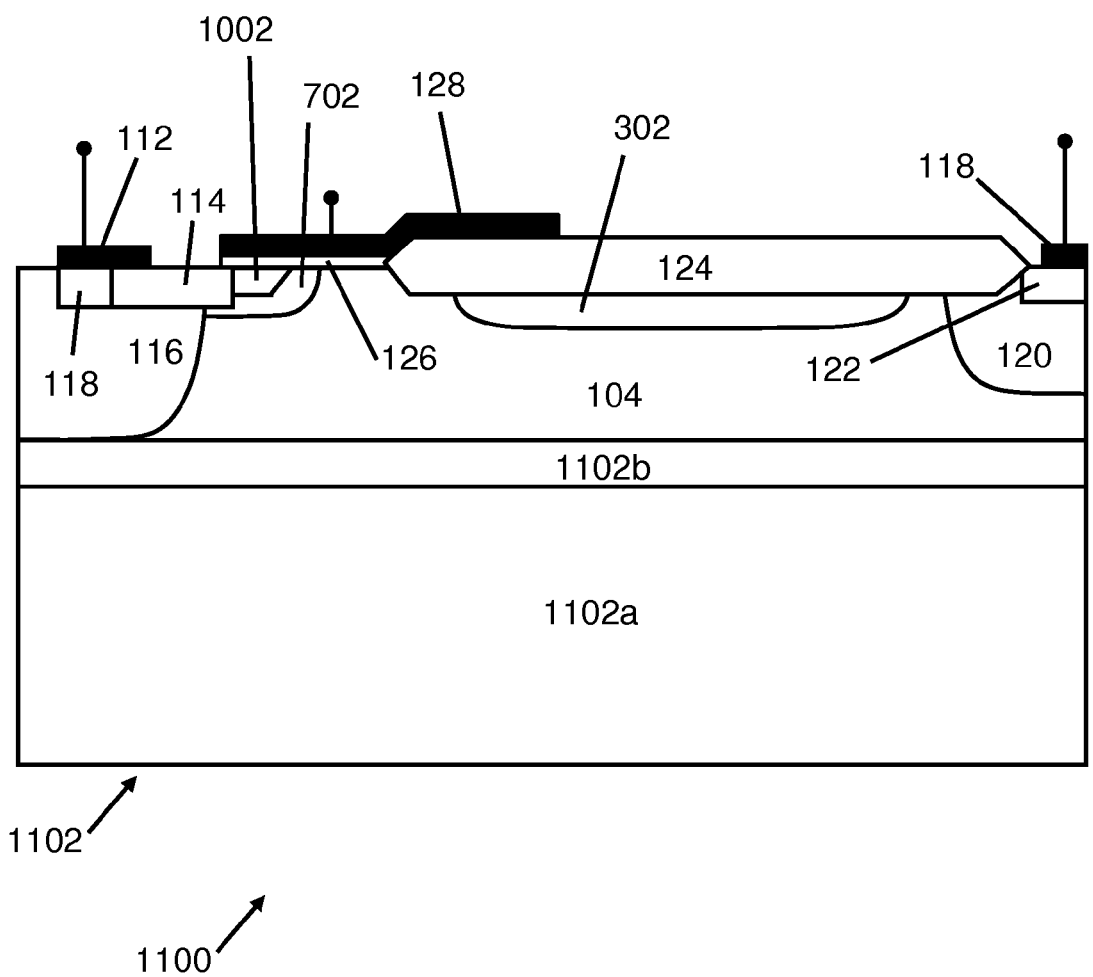
FIG. 11 shows, schematically, a vertical cross-section view of a RESURF LDMOSFET according to an embodiment of the invention, using silicon on insulator (SOI) technology.

FIG. 11 shows a further variant of the LDMOSFET structure 1100, in which the device is fabricated on a silicon-on-insulator (SOI) substrate 1102 comprising a silicon substrate 1102a bearing a buried oxide layer 1102b. This device uses a single RESURF effect.

Figure 12:
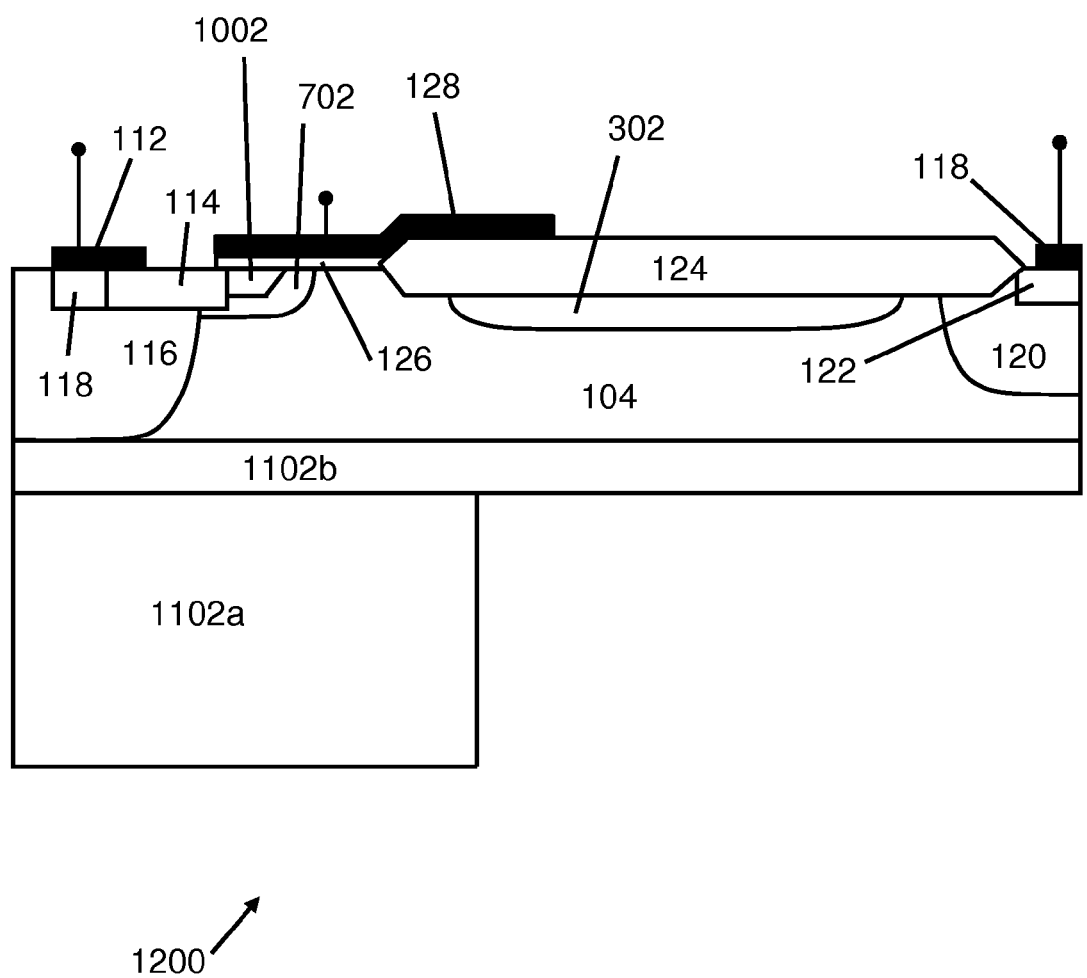
FIG. 12 shows, schematically, a vertical cross-section view of a RESURF LDMOSFET according to an embodiment of the invention, formed in a suspended membrane.

FIG. 12 illustrates a further variant of the LDMOSFET structure 1200 similar to that of FIG. 11, but where the device is fabricated in a membrane supported on the buried oxide 1102b away from the underlying substrate (as described in the applicant's U.S. Pat. No. 6,703,684 and related patents, ibid). This device also uses a single RESURF effect.

FIGS. 13 to 17 show some example variations to the devices so far discussed, showing a schematic view of the regions in proximity to the MOS channel of a lateral power device according to the invention illustrating variations of the configuration of the p-top channel portion. The variations described may be applied to any lateral power device type including, but not limited to, LDMOSFETs and LIGBTs.

Figure 13:
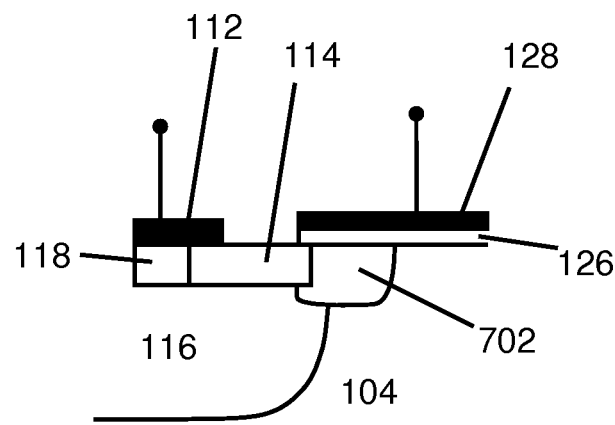
FIG. 13 shows, schematically, a vertical cross-section view of a first variant of a structural configuration according to an embodiment of the invention.

Thus whilst FIGS. 7 to 12 illustrate an arrangement in which the channel p-top region 702 connects directly to both p-well 116 and $n^+$ region 114, FIG. 13 illustrates a first variant in which the p-top channel region 702 directly connects to $n^+$ region 114, and in which the lateral diffusion of p-well 116 extends under the channel p-top portion 702. Thus this example features a p-well region that extends laterally beyond the extent of the n+ source region.

Figure 14:
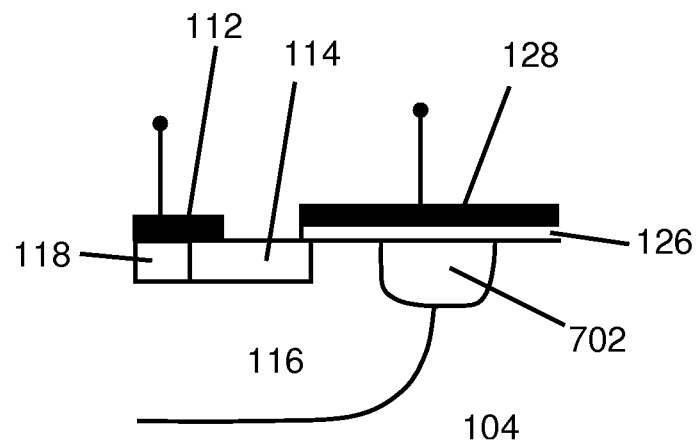
FIG. 14 shows, schematically, a vertical cross-section view of a second variant of a structural configuration according to an embodiment of the invention.

FIG. 14 illustrates a further variant in which the p-top region 702 connects directly to p-well 116, but indirectly to $n^+$ region 114, through the p-well, the p-top region 702 abutting the p-well 116. Thus this example features a p-top channel region that is not in direct contact with the n+ source region. Instead, the p-top region makes contact with the n+ source region indirectly, via the p-well region.

Figure 15:
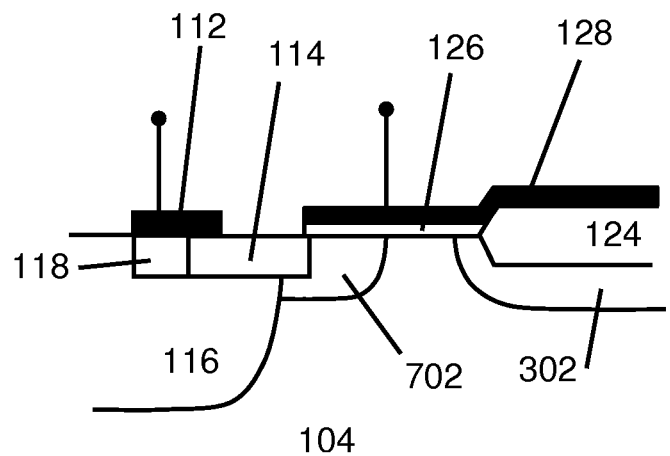
FIG. 15 shows, schematically, a vertical cross-section view of a third variant of a structural configuration according to an embodiment of the invention.

FIG. 15 also shows a schematic view of the regions in proximity to the MOS channel of a lateral power device according to the invention. In contrast to the devices described in relation to FIGS. 7 to 14, this example features a p-top RESURF region 302 of the p-top layer that extends laterally beyond the extent of the field oxide region 124 to lie partly beneath the gate oxide 126.

Figure 16:
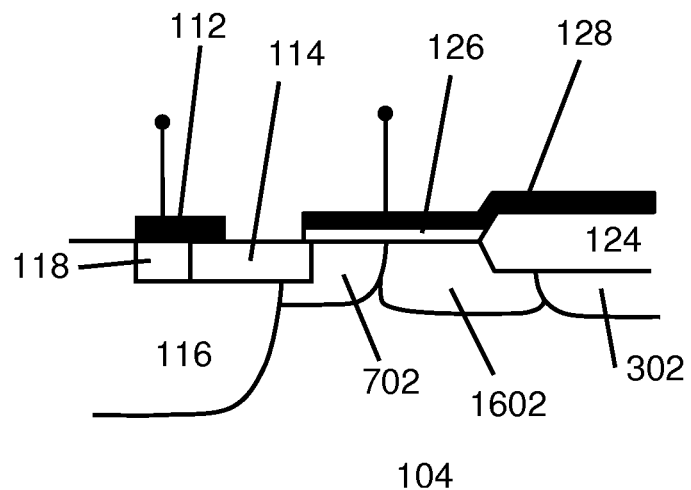
FIG. 16 shows, schematically, a vertical cross-section view of a RESURF LDMOSFET according to an embodiment of the invention comprising a p-top layer incorporating an n$^+$ JFET suppression region.

The example of FIG. 16 features an n JFET suppression region 1602 inserted between the p-top channel region 702 and the p-top RESURF region 302. This JFET suppression region has higher doping than the n-drift region and can aid suppression of the parasitic JFET behaviour mentioned previously.

Figure 17:
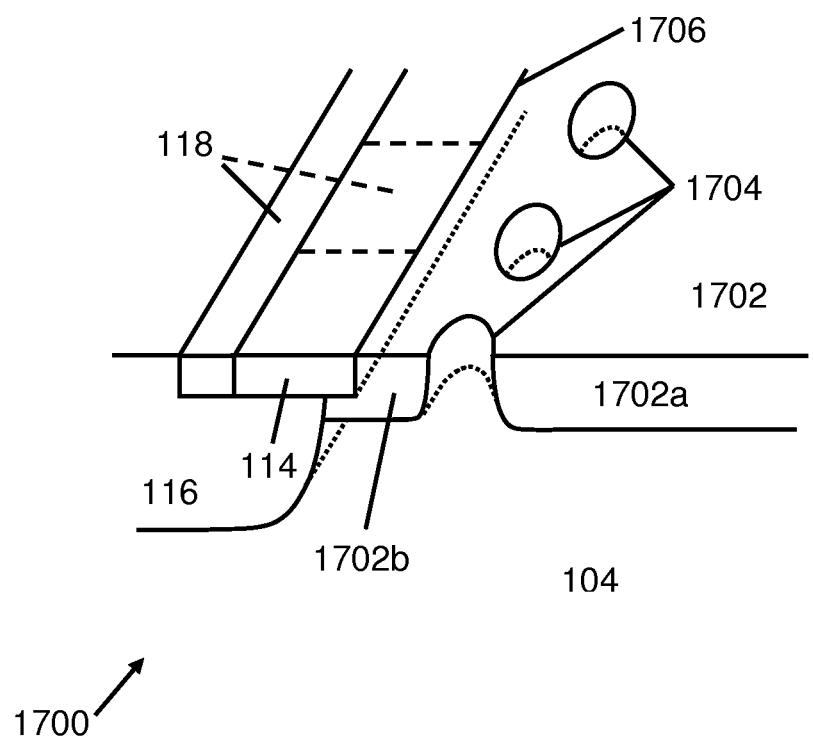
FIG. 17 shows a perspective view of a RESURF LDMOSFET according to an embodiment of the invention comprising a continuous p-top layer with n$^+$ JFET suppression islands.

Referring next to FIG. 17 this shows a perspective view of a portion of a further variant of an LDMOSFET structure 1700 according to an embodiment of the invention. In this structure a continuous p-top layer 1702 is divided into a first, RESURF p-top portion 1702a and second, channel p-top portion 1702b by $n^+$ islands 1704, which again help to suppress an unwanted parasitic JFET effect. In embodiments the islands 1704 may be n-drift or n JFET suppression regions. This type of structure allows tailoring of the properties of the accumulation layer, by adjusting the width(s), shape(s) and length(s) of the n regions relative to the p-top regions interspersed between them.

A further feature of the FIG. 17 structure, which may be employed separately to or in combination with the islands 1704, is the transverse lateral stripe 1706. This may be an $n^+$ region (as illustrated) or may comprise alternating $n^+$ regions 114 and $p^+$ connection regions 118 (as indicated by the dashed lines). With the latter arrangement the second, channel p-top portion 1702b connects directly to both the $n^+$ and $p^+$ regions of the source structure.

FIGS. 18a to 18j illustrate schematically how a power device may be manufactured according to the invention, taking as an example a particular 700 V bulk silicon n-channel LIGBT 1800 (see FIG. 18j); the final structure is similar to that of FIG. 7.

Figure 18A:
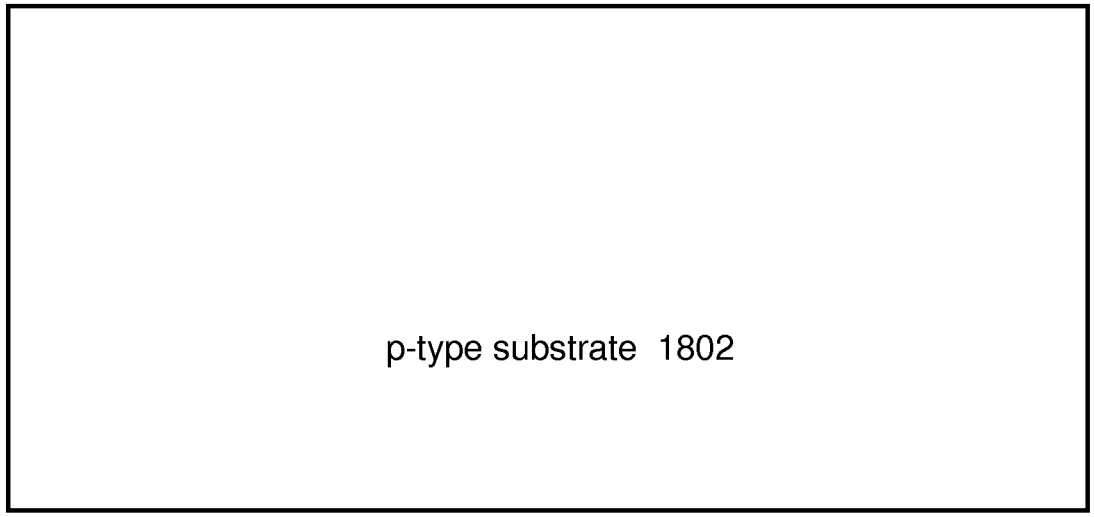
FIGS. 18a to 18j show, respectively, steps in the fabrication of a RESURF semiconductor device in a method according to an embodiment of the invention.

The starting material is a lowly-doped p-type silicon substrate 1802, as shown in FIG. 18a. A typical doping concentration for the substrate may be around $1 \times 10^{14}/cm^3$ to $1 \times 10^{15}/cm^3$, but this depends on application-specific requirements.

Figure 18B:
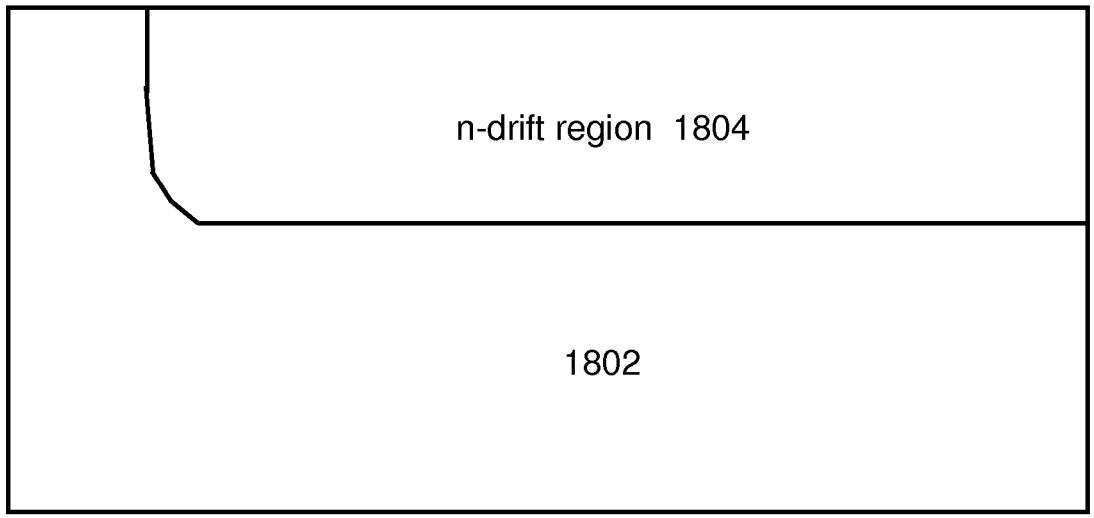

In a subsequent step, represented by FIG. 18b, an n-drift region 1804 is formed by diffusion to a depth of, for example, from about 3 μm to about 20 μm. The n-drift doping concentration may be arranged to be between around $5 \times 10^{14}$ $cm^{-3}$ to $5 \times 10^{15}$ $cm^{-3}$.

Figure 18C:
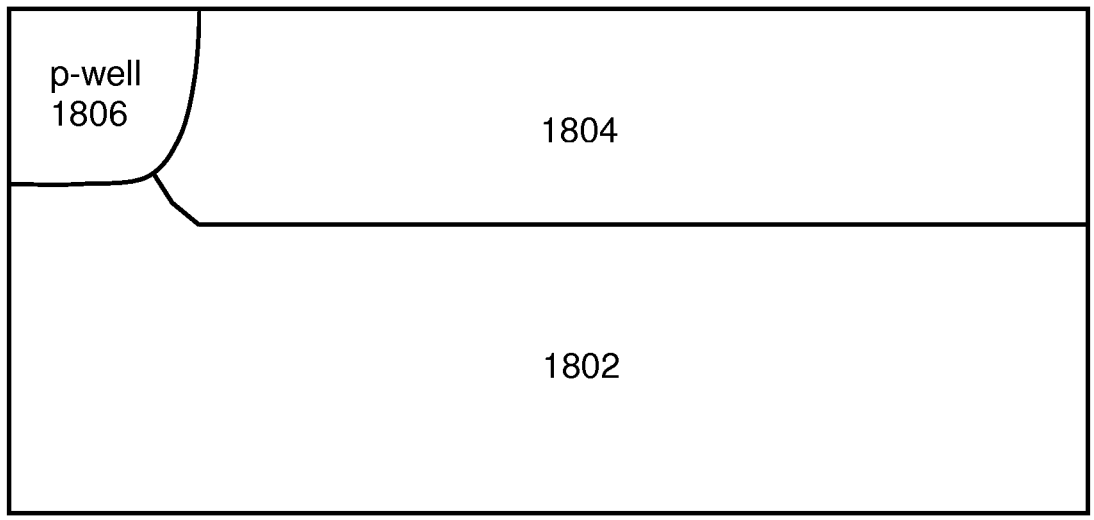

A p-well region 1806 is formed at one end of the drift region in a subsequent step, represented by FIG. 18c. The p-well diffusion may extend to a depth of between around 3 μm to around 10 μm and may have a surface doping concentration of $5 \times 10^{15}$ $cm^{-3}$ to $10^{17}$ $cm^{-3}$.

Figure 18D:
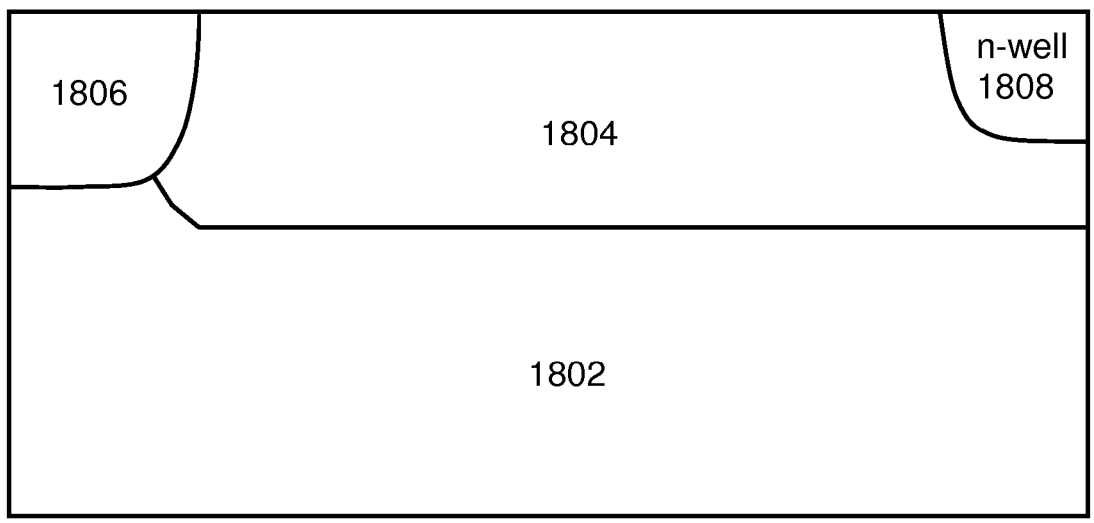

In a subsequent step, represented by FIG. 18d, an n-well region 1808 is formed in the end of the n-drift region opposite to that where the p-well is located. The n-well serves as a buffer for stopping the electric field from reaching the high voltage terminal region in the off-state blocking mode. This avoids punch-through. The surface doping concentration of the n-well may be in the range of about $5 \times 10^{16}$ $cm^{-3}$ to $5 \times 10^{17}$ $cm^{-3}$.

Figure 18E:
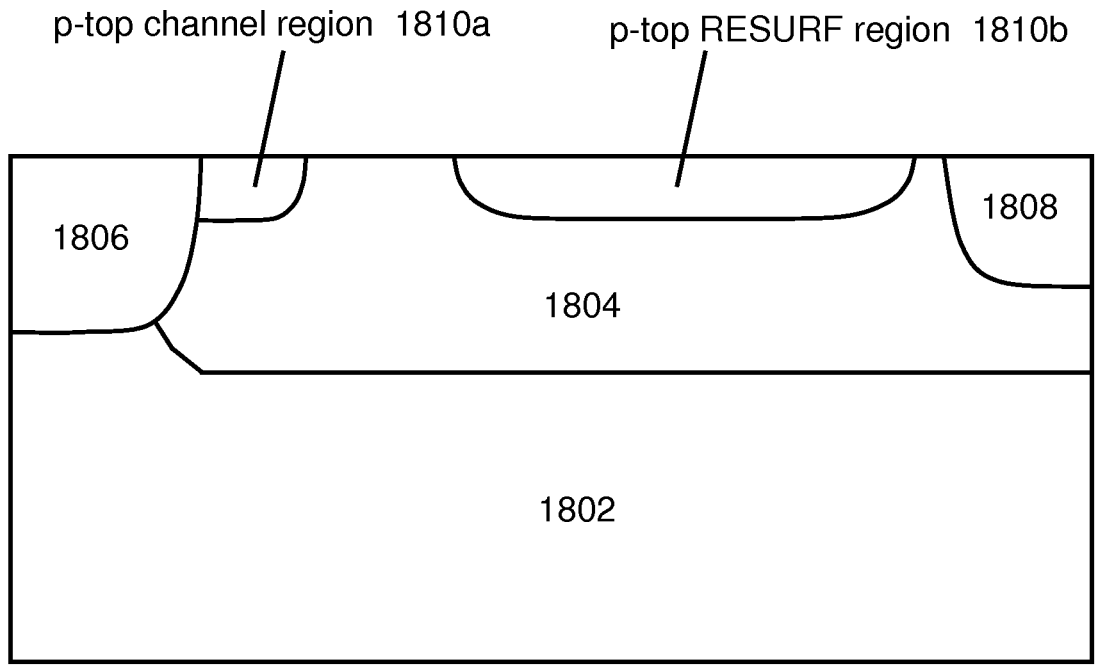

FIG. 18e represents a subsequent step, in which p-top regions 1810a,b are formed, by ion implantation using a mask to define the different portions of the p-top layer: This locks the relative positions of the p-top layer portions 1810a, 1810b. The p-top layer is typically 0.5 μm to 3 μm deep and has a surface doping concentration of around $2 \times 10^{15}$ $cm^{-3}$ to $3 \times 10^{16}$ $cm^{-3}$. For a particular device, the doping concentration of the p-top layer is higher than the doping concentration of the drift layer. A p-top channel region 1810a is formed in contact with the p-well, and a p-top RESURF region 1810b is formed between the p-top channel region and the n-well. The edge of the p-top channel region that is nearest to the high voltage terminal defines a first end of the MOS channel of the LIGBT.

Figure 18F:
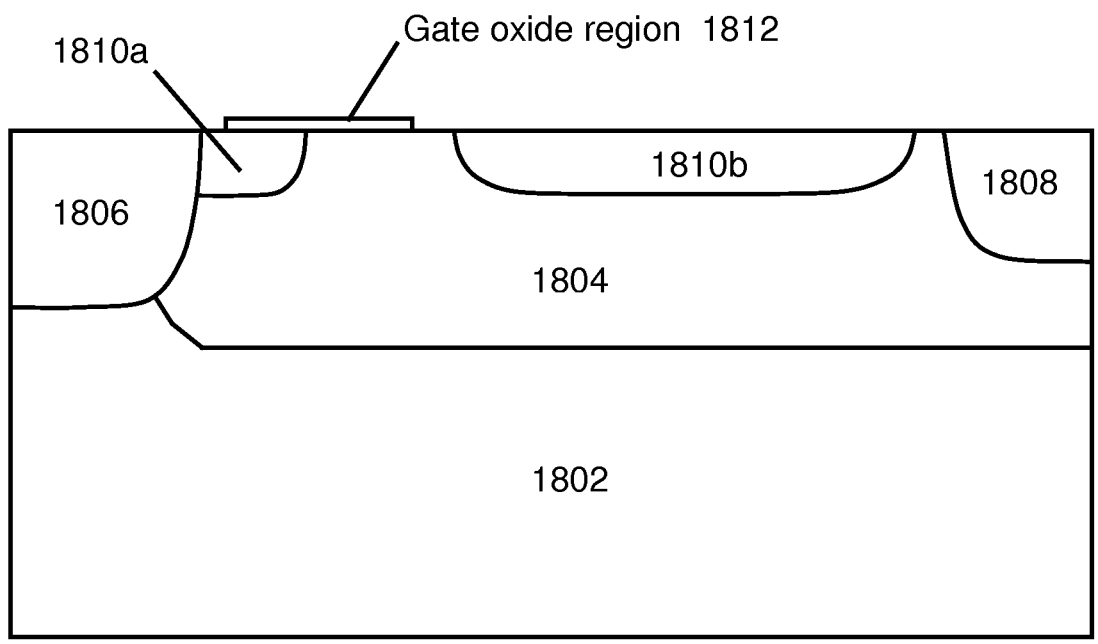
Figure 18G:
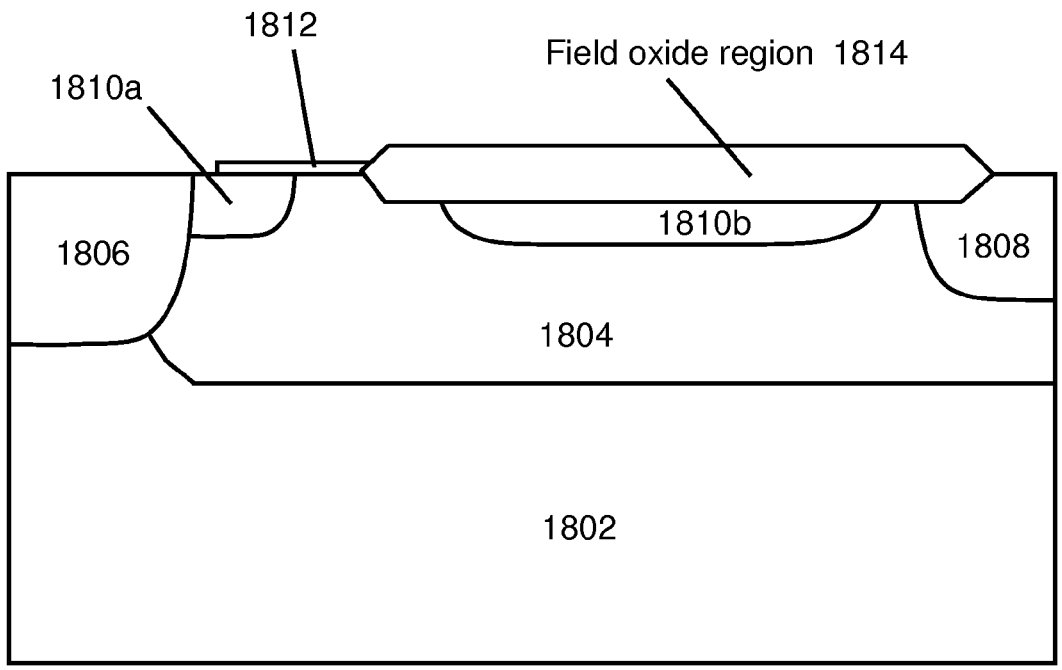

In a subsequent step a gate oxide region 1812 is formed on the upper surface of the p-top channel region 1810a and n-drift region 1804. This step is represented by FIG. 18f. The gate oxide thickness is typically between 10 nm and 100 nm. A field oxide region 1814 is formed in a subsequent step, as represented by FIG. 18g, for example by a LOCOS (local oxidation of silicon) process. The field oxide is formed on the upper surface of the n-drift region 1804 and p-top RESURF region 1810b, and extends laterally to the n-well region 1808. The thickness of the field oxide is in the range of 0.2 to 1 μm.

Figure 18H:
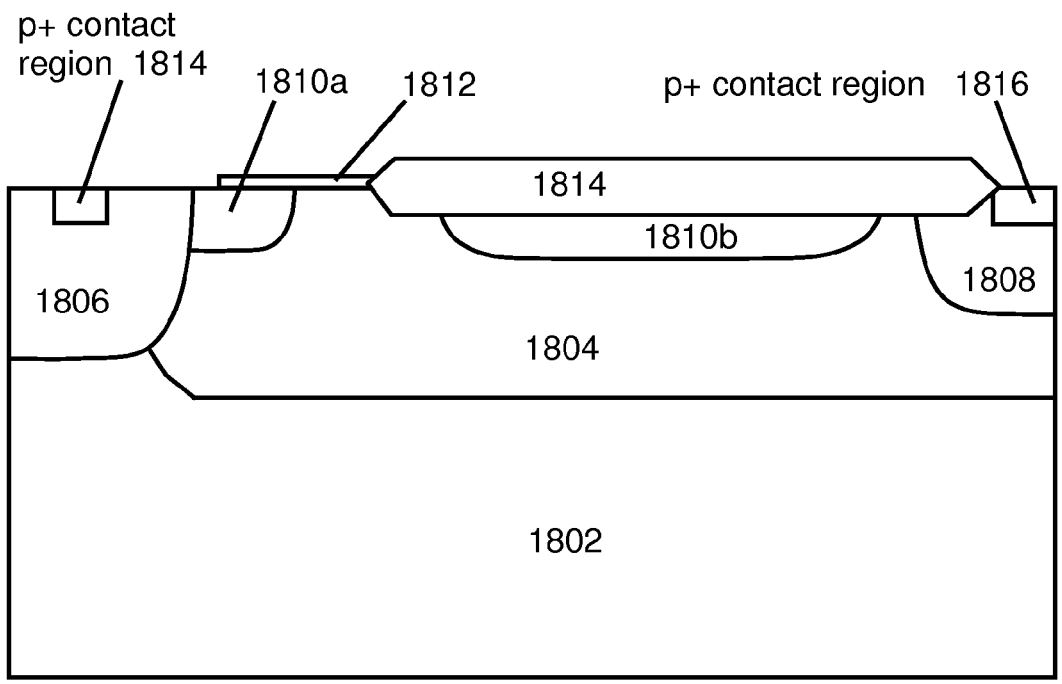

A p+ low voltage terminal contact region 1814 is formed in the p-well region 1806 and a p+ high voltage terminal contact region 1816 is formed in the n-well region 1808, as represented by FIG. 18h. These p+ contact regions may be formed simultaneously if their doping concentrations are to be the same, or they may be formed in separate steps if different doping concentrations are required. See the inventors' co-pending U.S. patent application Ser. No. 12/648,818 (US2011/0057230) for considerations of contact region doping concentrations in bulk silicon LIGBTs.

Figure 18I:
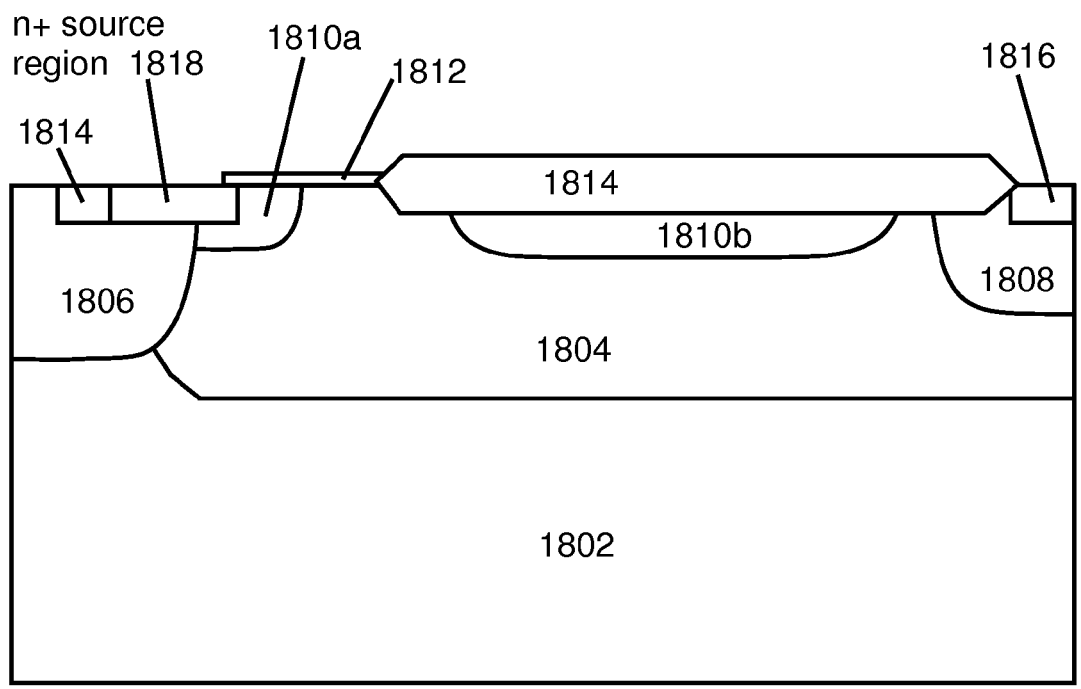

A highly doped n+ source region 1818 having a depth of between around 0.1 to 1 µm and doping concentration in excess of $10^{19}$ cm$^{-3}$ is formed in the p-well 1806 in a subsequent step, as represented in FIG. 18i. One end of the n+ source region 1818 is in contact with the p+ low voltage terminal contact region 1814, whilst the other end of the n+ source region defines a second end of the MOS channel of the LIGBT.

Figure 18J:
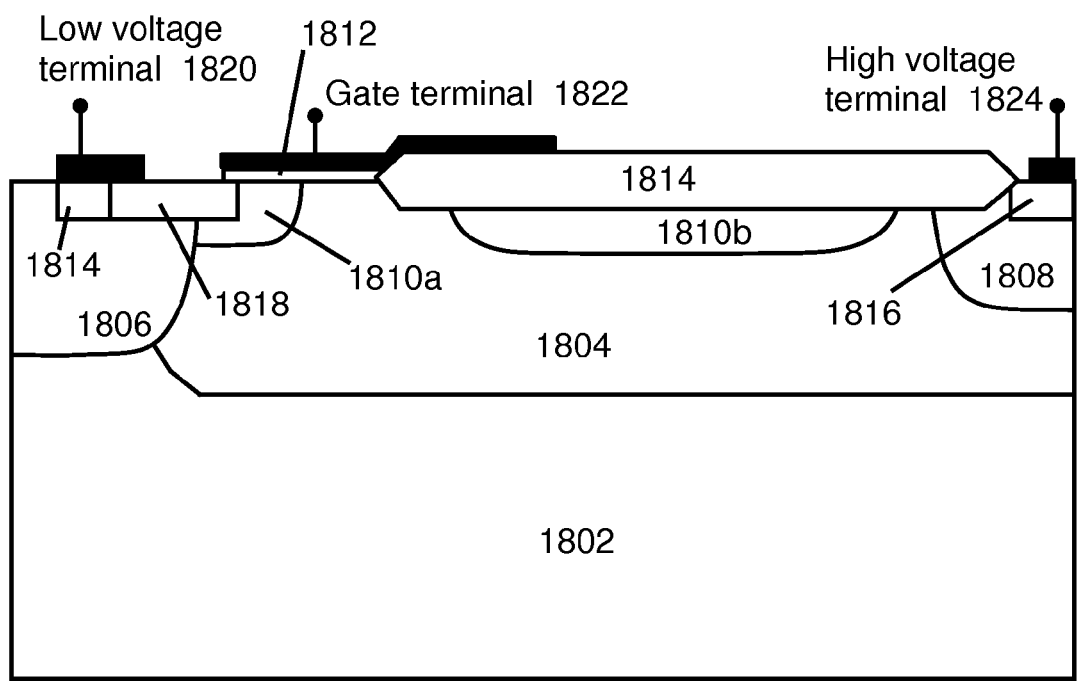

FIG. 18j shows a subsequent step, wherein conductive terminal regions 1820, 1822, 1824 are formed. The low voltage terminal region 1820 is in contact with the p+ low voltage terminal contact region 1814 and the n+ source region 1818. The high voltage terminal region 1824 is in contact with the p+ high voltage terminal contact region 1816. A gate terminal region 1822 is formed above the gate oxide region 1812, providing a control terminal for the LIGBT. The gate terminal 1822 may extend onto the field oxide region 1814 to form a field plate, providing an enhancement of the LIGBT breakdown voltage.

Figure 19:
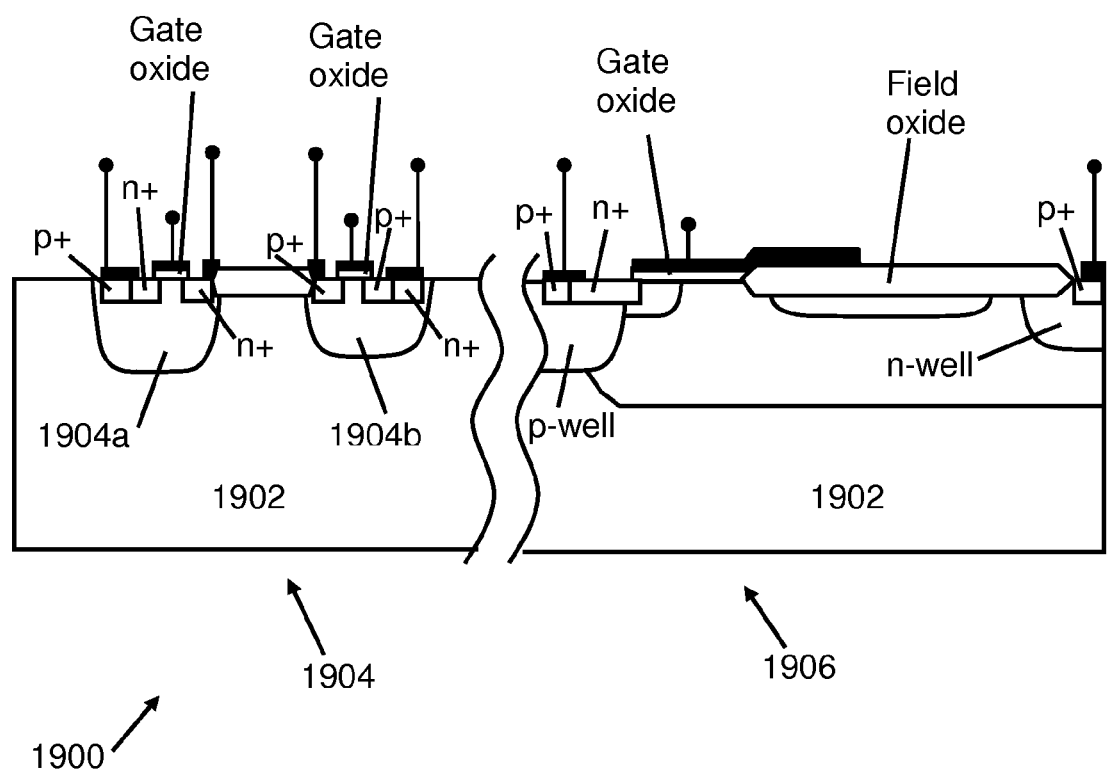
FIG. 19 shows, schematically, a vertical cross-section view of a CMOS integrated circuit incorporating a power RESURF semiconductor device according to an embodiment of the invention.

FIG. 19 illustrates a CMOS power integrated circuit 1900, showing schematically how a power device according to the invention may co-exist with low voltage circuitry on a power IC: A single lowly-doped p$^-$-type substrate 1902 supports both low voltage circuitry and one or more power devices. On the left-hand side of the figure, low voltage circuitry is represented by a twin-tub CMOS cell 1904 comprising a p-well 1904a and an n-well 1904b, within each of which is fabricated a respective MOS transistor. On the right-hand side of the figure, a power device is represented by a LIGBT 1906 according to an embodiment of the invention.

Some isolation means, for example trench isolation may separate the low power circuitry from the power device(s). A number of features of the low power circuitry may be formed simultaneously with features of the power device(s). For example, the p-well regions of the low voltage circuitry and of the high power device(s) may be formed during the same processing step.

In another approach, two or more similar or dissimilar power devices are formed on the same silicon substrate. For example a number of power switches on one region of substrate may be connected to each other in parallel or may operate independently. In another example, one region of silicon substrate may comprise one or more power LIGBTs and one or more power MOSFETs. A number of features of one type of power device may be formed simultaneously with features of other types of power device(s).

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A double RESURF semiconductor device having an n-drift region with a p-top layer, and wherein a MOS (Metal Oxide Semiconductor) channel of said device is formed within said p-top layer, wherein said p-top layer comprises a first p-top portion in or adjacent said n-drift region, and a second p-top portion adjacent to an n$^+$region or p-well region of a source structure of said device, and wherein the first and second p-top portions are laterally spaced to one another and wherein the device is configured such that a surface field of said n-drift region of said device is reduced by said first p-top region when said device is off and in a blocking mode.

2. A double RESURF semiconductor device as claimed in claim 1 wherein said source structure comprises said n$^+$ region, a source connection to said n$^+$ region and a p-well beneath said n$^+$ region, wherein said n-drift region is bonded laterally by said p-well, and wherein said second p-top portion extends above said n-drift region and is shallower than said p-well.

3. A double RESURF semiconductor device as claimed in claim 1 wherein said second p-top portion further comprises a threshold adjust implant.

4. A double RESURF semiconductor device as claimed in claim 1, further comprising a high voltage structure, wherein said high voltage structure comprises an n-well and a high voltage connection to said n-well, and wherein said n-drift region extends to said n-well of said high voltage structure.

5. A double RESURF semiconductor device as claimed in claim 4 wherein said device is an LDMOSFET.

6. A double RESURF semiconductor device as claimed in claim 4 wherein said device is an LIGBT and wherein said high voltage structure further comprises a p$^+$ region within said n-well electrically connected to said high voltage connection of said device.

7. A double RESURF semiconductor device as claimed in claim 1 further comprising a gate oxide layer over said second p-top portion and over a portion of said n-drift region laterally between said first and second p-top portions, a field oxide layer over said first p-top portion, and a gate electrode over said gate oxide and field oxide layers and above at least said second p-top portion.

8. A double RESURF semiconductor device as claimed in claim 7 wherein said gate electrode is also above said portion of said n-drift region laterally between said p-top portions.

9. A double RESURF semiconductor device as claimed in claim 7 wherein said gate electrode is above an n$^+$ region between said first and second p-top portions.

10. A double RESURF semiconductor device as claimed in claim 7 wherein the device is configured such that when a high voltage is applied across said n-drift region a flow of current through said n-drift region is controlled by applying a voltage to a gate electrode of said MOS channel to control a current flow through a channel at the surface of said second p-top portion.

11. A double RESURF semiconductor device as claimed in claim 1 wherein said p-top layer has a lateral gap comprising an n-type region, and wherein to one lateral side of said gap said p-top region comprises a MOS channel of said semiconductor device and to an opposite lateral side of said gap said p-top region comprises an n-drift region surface-field reducing part of said semiconductor device.

12. A double RESURF semiconductor device as claimed in claim 1 wherein said substrate is an SOI substrate with a buried oxide layer beneath said n-drift region.

13. A double RESURF semiconductor device as claimed in claim 12 wherein an opening is provided beneath a portion of said buried oxide layer beneath said n-drift region such that said buried oxide beneath said n-drift region is suspended by an adjacent portion of said substrate.

* * * * *